(12) United States Patent
Shiv et al.

(10) Patent No.: US 7,553,695 B2
(45) Date of Patent: Jun. 30, 2009

(54) METHOD OF FABRICATING A PACKAGE FOR A MICRO COMPONENT

(75) Inventors: Lior Shiv, Hilleroed (DK); Kristian Blidegn, Copenhagen (DK)

(73) Assignee: Hymite A/S (DK)

( * ) Notice: Subject to any disclaimer, the term of this patent is extended or adjusted under 35 U.S.C. 154(b) by 348 days.

(21) Appl. No.: 11/082,507

(22) Filed: Mar. 17, 2005

(65) Prior Publication Data
US 2006/0210234 A1     Sep. 21, 2006

(51) Int. Cl.
*H01L 21/50* (2006.01)
*H01L 21/48* (2006.01)
*H01L 21/44* (2006.01)

(52) U.S. Cl. .................. 438/107; 438/455; 438/456; 438/459

(58) Field of Classification Search .............. None
See application file for complete search history.

(56) References Cited

U.S. PATENT DOCUMENTS

| | | | |
|---|---|---|---|
| 5,915,168 A * | 6/1999 | Salatino et al. | ............ 438/110 |
| 6,300,676 B1 * | 10/2001 | Kawai | ........................ 257/678 |
| 6,818,464 B2 | 11/2004 | Heschel | |
| 7,049,175 B2 * | 5/2006 | Schaper et al. | ............. 438/113 |
| 2004/0077154 A1 | 4/2004 | Nagarajan et al. | |
| 2004/0198040 A1 | 10/2004 | Geefay et al. | |
| 2005/0062122 A1 | 3/2005 | Gallup et al. | |

FOREIGN PATENT DOCUMENTS

EP    1 071 126    1/2001

* cited by examiner

*Primary Examiner*—N Drew Richards
*Assistant Examiner*—Khanh B Duong
(74) *Attorney, Agent, or Firm*—Fish & Richardson P.C.

(57) ABSTRACT

Techniques are disclosed for fabricating a relatively thin package for housing a micro component, such as an optoelectronic or MEMs device. The packages may be fabricated in a wafer-level batch process. The package may include hermetically sealed feed-through electrical connections coupling the micro component to electrical contacts on an exterior surface of the package.

16 Claims, 31 Drawing Sheets

METHOD OF FABRICATING A PACKAGE FOR A MICRO COMPONENT

BACKGROUND

The disclosure relates to packaging for micro components.

Proper packaging of optoelectronic and other micro components is important to ensure the integrity of the signals to and from the micro components and often determines the overall cost of the assembly.

U.S. Pat. No. 6,818,464, assigned to the assignee of this application, discloses a technique for fabricating a package that can be used to house, for example, an optoelectronic device. As disclosed in that patent, the optoelectronic component may be mounted to a base. A semiconductor cap can be attached to the base so as to hermetically enclose the optoelectronic component. Feed-through metallization through the cap can be used to provide electrical connections from the exterior of the cap to the optoelectronic component housed within the package.

Typically, the thickness of semiconductor wafers used for caps in such packaging may be on the order of at least several hundred microns (e.g, 300-700 μm). However, for some applications, thinner caps would be desirable. Unfortunately, thin caps tend to be more difficult to handle and may result in lower production yield.

SUMMARY

Techniques are disclosed for fabricating a relatively thin package for housing one or more micro components. The package may be fabricated, for example, in a wafer-level batch process.

According to one aspect, a method of fabricating a package for a micro component may include bonding a first wafer to a second wafer so that the micro component is located in an area defined by the first and second wafers, and subsequently thinning the first wafer from its backside.

In some implementations, the package may include feed-through metallization that couples the micro component to electrical contacts on an exterior surface of the package. Thus, according to another aspect, a method is disclosed for processing a package for a micro component that is located in an area defined by first and second wafers that are bonded together. The first wafer includes feed-through metallization at least partially filling micro-vias from the front-side of the first wafer, and the feed-through metallization forms part of one or more electrical paths to or from the micro component. The method may include thinning the first wafer from its backside.

The disclosed techniques can provide a relatively thin micro component package that can be fabricated so as to reduce the likelihood of damage to the package during handling of the wafers.

Other features and advantages will be readily apparent from the following detailed description, the accompanying drawings and the claims.

DETAILED DESCRIPTION

Figure 1:
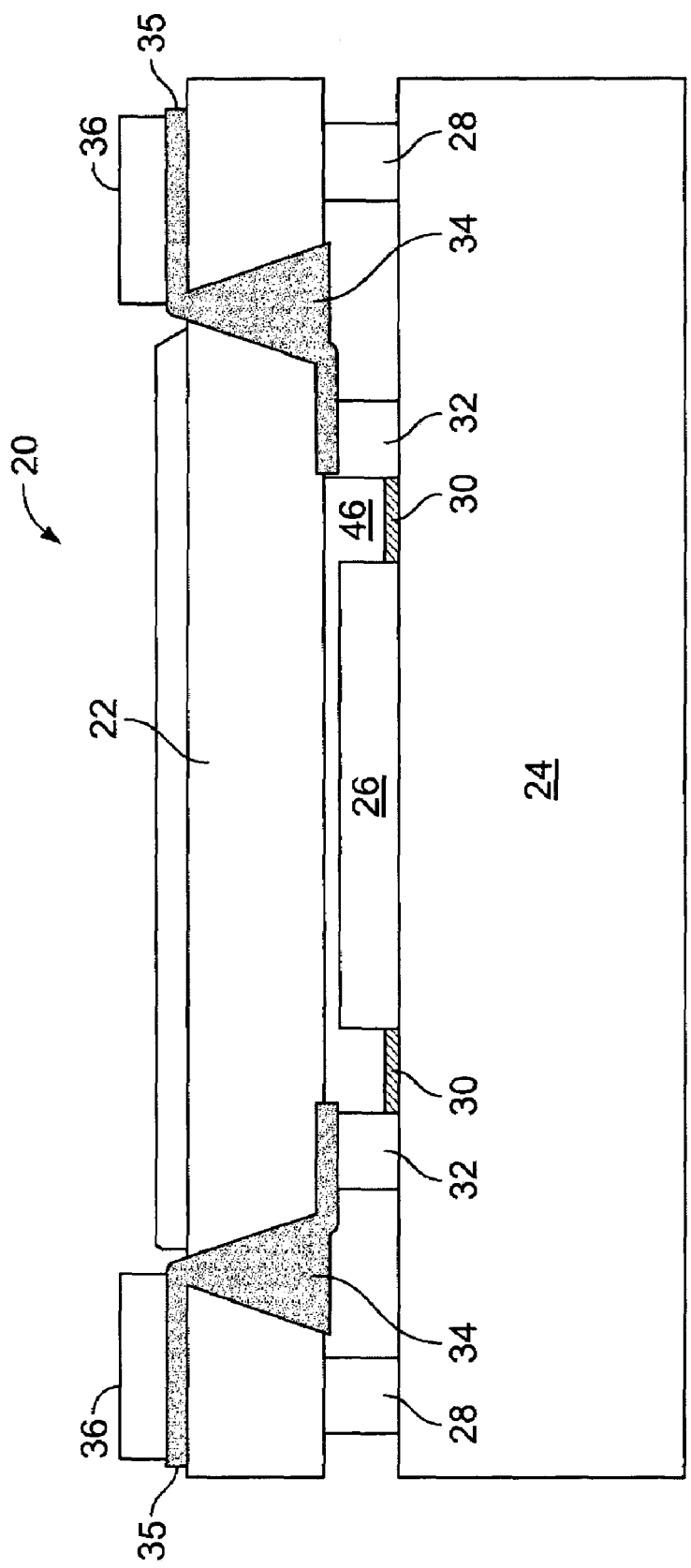
FIG. 1 illustrates a cross-sectional view of a micro component package according to an implementation of the present invention.

As shown in FIG. 1, a package 20 includes a cap 22 and a substrate (or base) 24. The cap 22 may comprise, for example, a semiconductor material such as silicon. The base 24 also may comprise a semiconductor material, such as silicon, or a glass material. A micro component 26 is mounted to, or integrated with, the base 24, which may be bonded to the cap 22, for example, by a sealing ring 28. The micro component 26 may be hermetically sealed within the package.

As used in this disclosure, the phrase "micro components" includes integrated circuit devices, electronic devices, optical devices, electromagnetic devices, chemical devices, micro-mechanical devices, optoelectronic devices, micro-electro-mechanical system (MEMS) devices, micro-optoelectromechanical system (MOEMS) devices or other such devices that contain tiny, micron and sub-micron-sized elements.

Electrically conductive lines 30 may extend along the surface of the base 26 from the micro component 26 to electrically conductive bumps 32 that are electrically connected to feed-through metallization 34 extending through micro-vias in the cap 22. At the exterior surface of the cap 22, the feed-through metallization serves as surface mount pads 35 which, in turn, may be electrically coupled to solder bumps 36. The solder bumps 36 may be connected, for example, to a printed circuit board (not shown). Using the techniques described in this disclosure, the final thickness of the cap 22 may be made as small as 200 μm or less for some implementations.

Multiple packages may be fabricated simultaneously in a wafer-level batch process. For example, multiple cap structures may be fabricated on a first wafer (which may be referred to as a "cap-wafer"). The cap-wafer then may be bonded to a second wafer (which may be referred to as a "device-wafer") on which micro components are mounted. The device-wafer may serve as a substrate that forms the bases of the packages.

As explained in greater detail below, the cap-wafer may have an initial thickness, for example, on the order of several hundred microns (e.g., 300-700 µm). The wafer may have a diameter, for example, of four inches. Larger diameter (e.g., 6-inch) wafers also may be suitable for some implementations. After the cap-wafer is bonded to the device-wafer, a mechanical grinding or other process may be used to thin the backside of the cap-wafer so that the resulting caps have a desired thickness, which may be as small as 200 µm or less. The wafers subsequently can be provided with solder-bumps, reflown, and diced to form individual packages housing the micro components.

Figure 2:
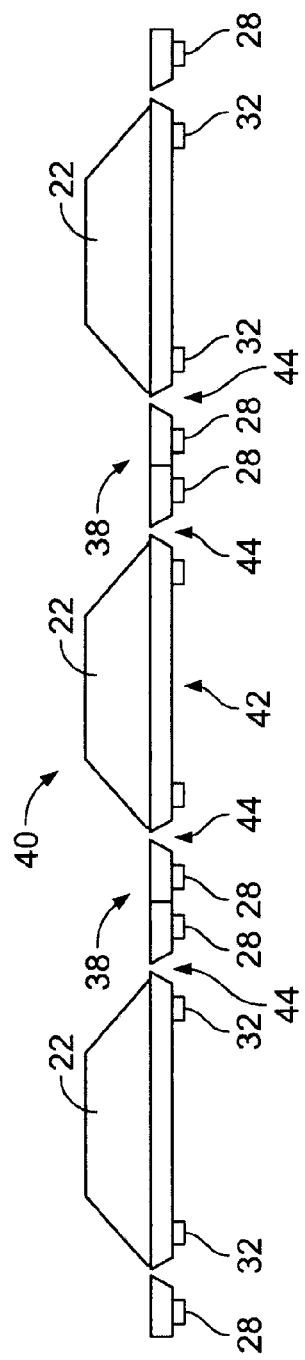
FIG. 2 illustrates a side view of a semiconductor wafer with cavities and micro-vias for a cap structure of the package.

One process which may be used to fabricate multiple cap structures on a wafer employs a double-sided etching technique. As shown in FIG. 2, the double-sided etching technique may be used to form large cavities 38 on the backside 40 of the cap-wafer. The cavities serve as the boundary between adjacent cap-structures.

Figure 2A:
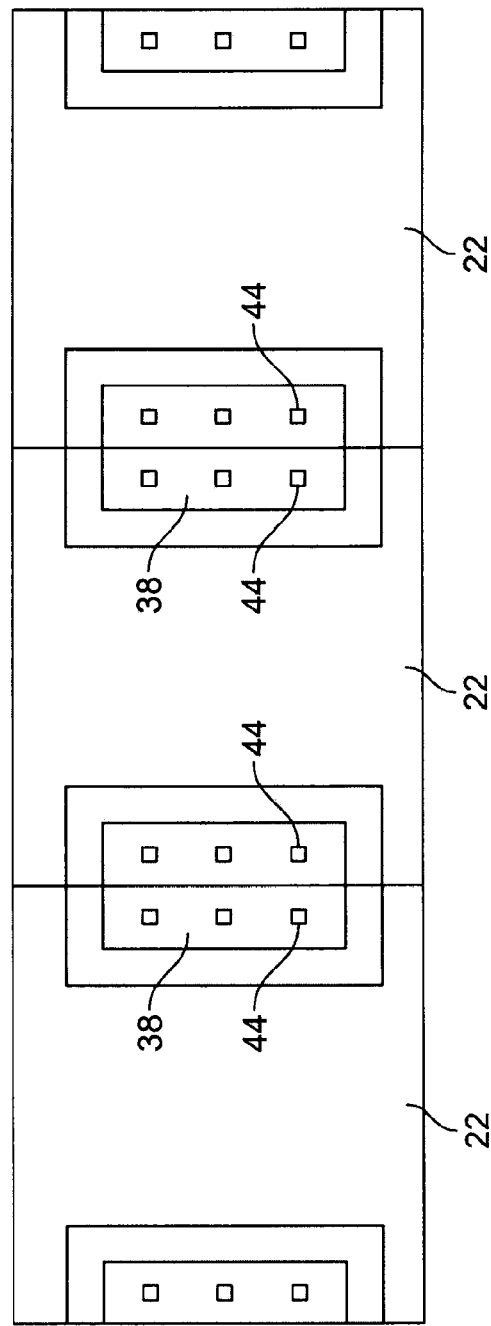
FIGS. 2A and 2B are top views of respective semiconductor wafers illustrating examples of possible locations of the micro-vias for feed-through metallization.
Figure 2B:
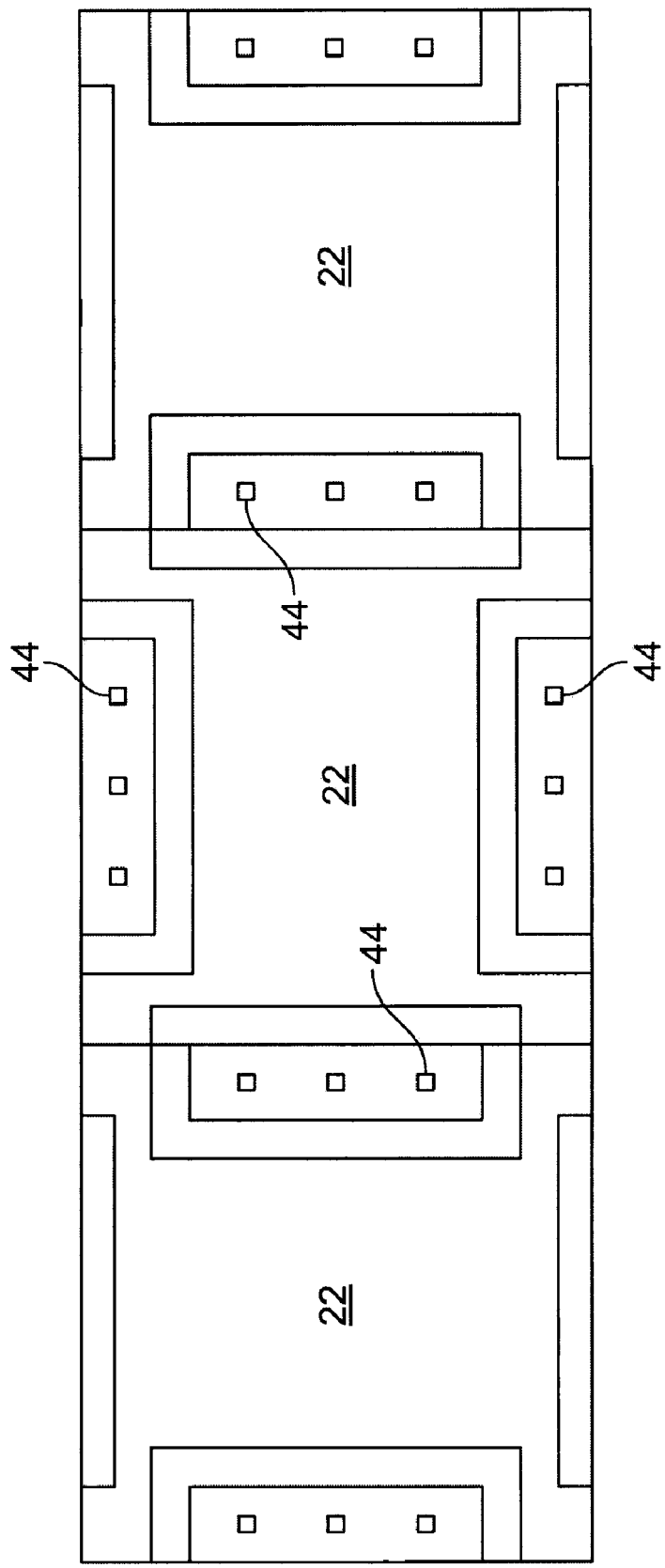

During the double-sided etch process, micro-vias 44 for the feed-through metallization may be etched from the front-side 42 of the cap-wafer. Preferably, the micro-vias are formed near the edges of the cavities 38, as shown, for example, in FIG. 2A. In some implementations, every other chip may be rotated by 90° as shown, for example, in FIG. 2B. Various etching techniques may be used to form the cavities 38 and micro-vias 44 depending on the material of the cap-wafer.

A wafer that is suitable for forming the caps 22 may have, for example, a multi-layer structure that includes a substantially etch-resistant layer sandwiched between first and second semiconductor layers. The first and second semiconductor layers may include, for example, silicon, and the etch-resistant layer may include, for example, silicon nitride, silicon oxy-nitride or silicon dioxide. One suitable etching technique uses a KOH wet etch. Further details of a multi-layer structure and examples of etching techniques are disclosed in U.S. Pat. No. 6,818,464, mentioned above. The disclosure of that patent is incorporated herein by reference in its entirety. Other wafer structures and other etching techniques may be used as well. For example, although FIG. 2 shows the sidewalls of the cavities 38 as being sloped, other etching techniques may result in sidewalls that are substantially vertical.

As can be seen from the example of FIG. 2, following formation of the cavities 38 and micro-vias 44, the cap-wafer still may have an overall thickness on the order of several hundred microns (e.g., 300-700 µm). Such a thickness facilitates subsequent handling and processing of the cap-wafer and reduces the likelihood of damage that might occur if the wafer were thinner.

Figure 3:
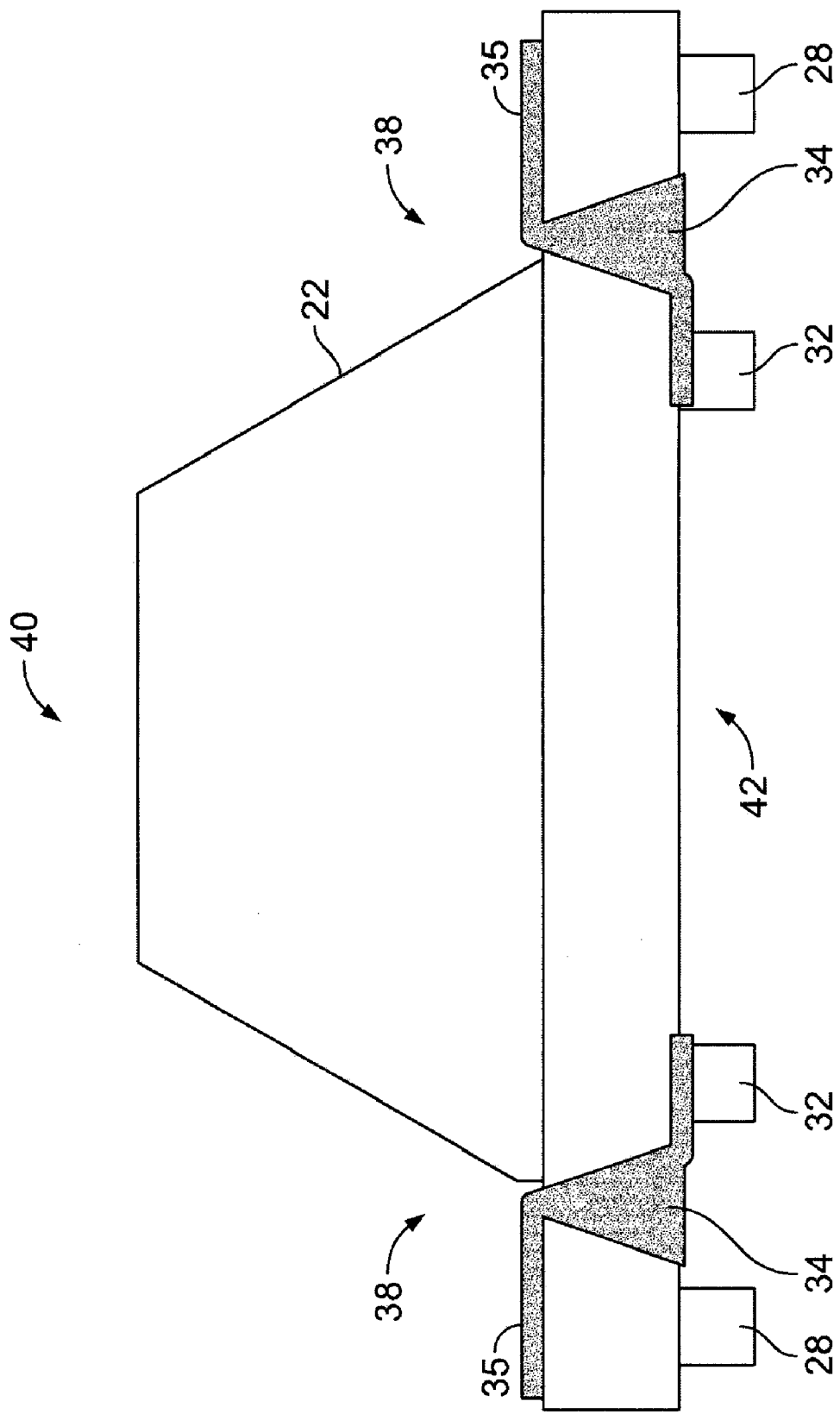
FIGS. 3 and 4 illustrate side views of the wafer of FIG. 2 after further processing.

After formation of the cavities 38 and micro-vias 44, the micro-vias may be hermetically sealed (see FIGS. 3 and 4), for example, using an electro-plated feed-through metallization technique. The feed-through metallization also may include a diffusion barrier, and the sealing material may include, for example, a non-noble metal. Further details of the such feed-through metallization techniques are disclosed in U.S. Pat. No. 6,818,464, previously mentioned.

The electrically conductive bumps 32 are provided on the front-side of the cap-wafer in electrical contact with the feed-through metallization.

Figure 5:
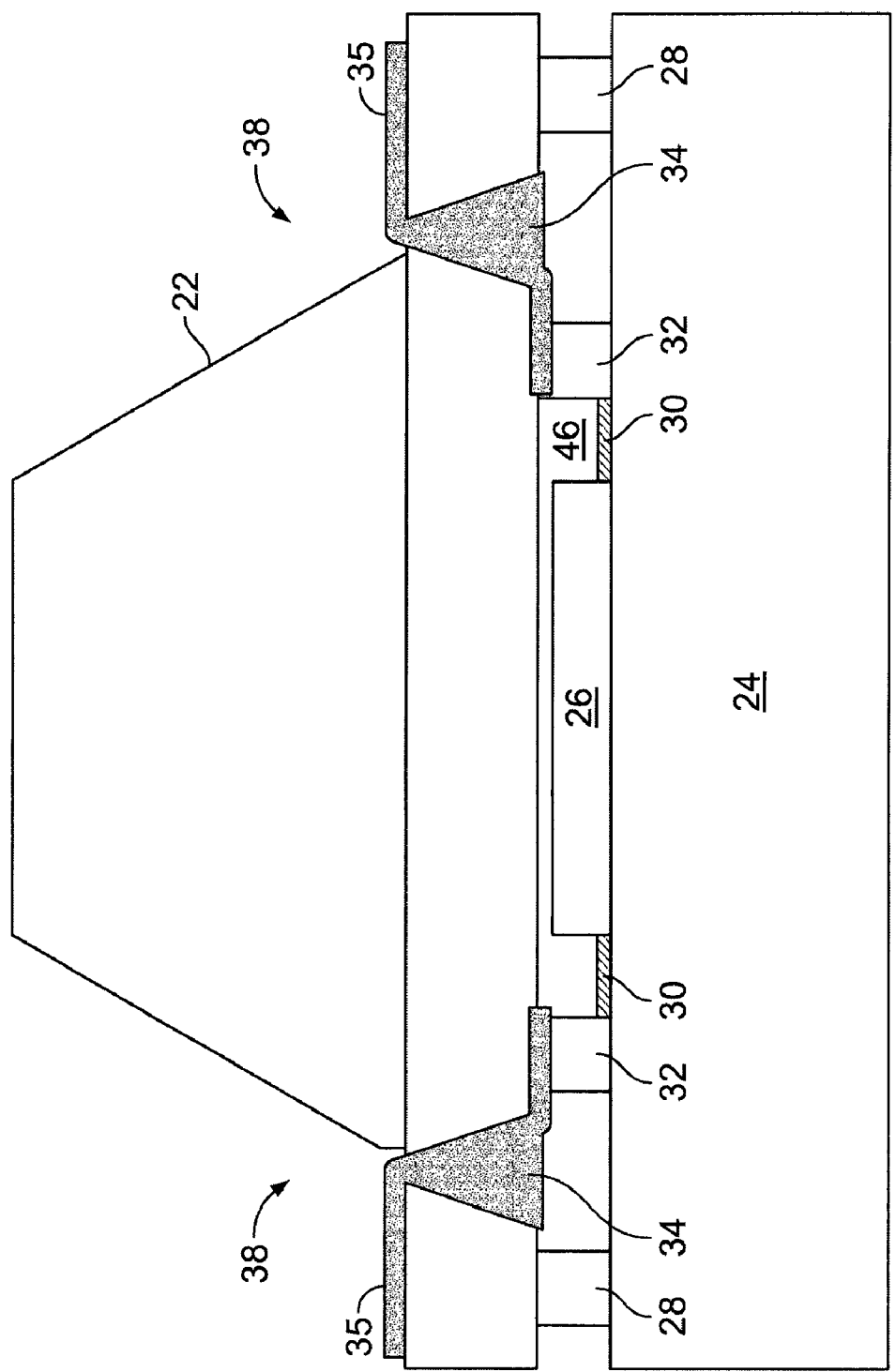
FIG. 5 illustrates the semiconductor wafer, with the cap structure, bonded to a second wafer in which a micro component is processed or on which it is mounted.

The cap-wafer may then be bonded to the device-wafer that serves as the substrate on which the micro components are mounted (see FIG. 5). The cap-wafer and device-wafer are aligned so that the electrically conductive bumps 32 contact the electrically conductive lines 30 extending along the surface of the base 24 from the micro component 26 and so that the micro component fits within the area 46 between the wafers. As discussed above, a sealing ring 28 may provide a seal so that the micro component 26 is hermetically housed in the area 46.

Figure 6:
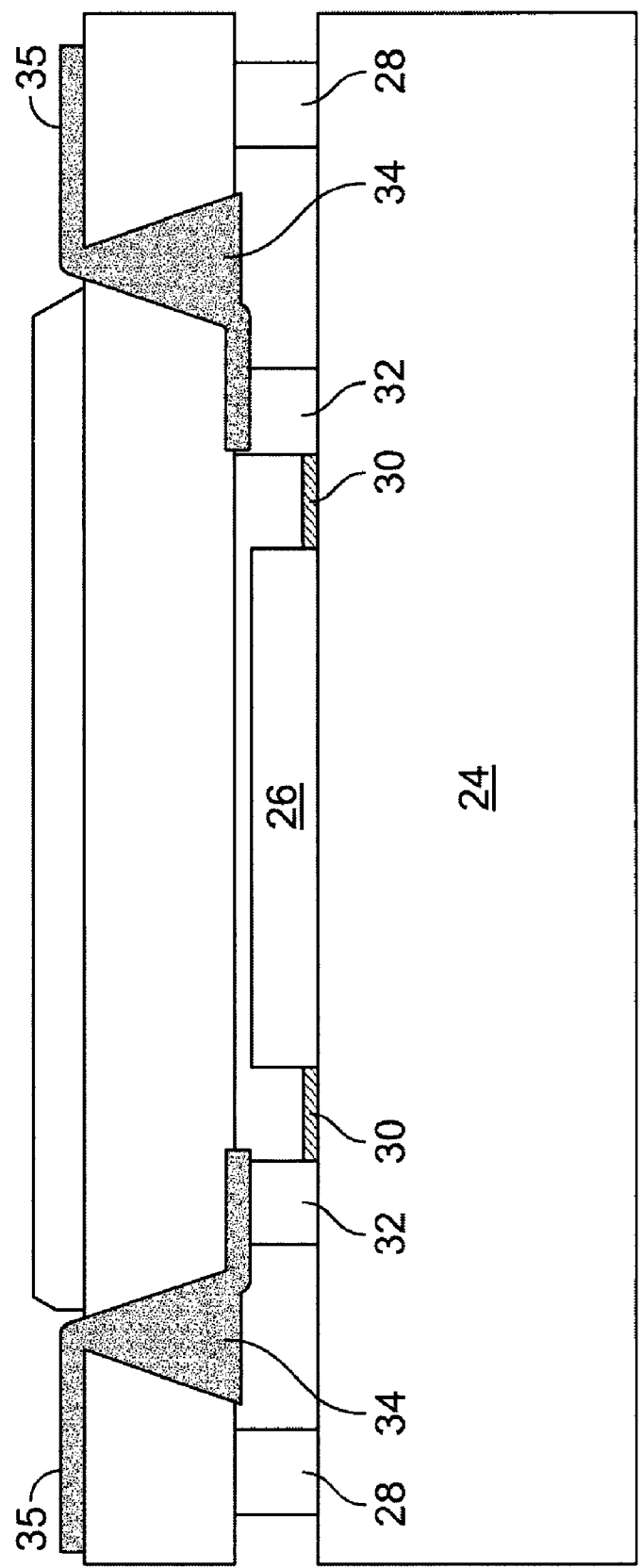
FIG. 6 illustrates the wafers of FIG. 5 after thinning the backside of the wafer with the cap structure.

After the cap-wafer and device-wafer are bonded, for example, as shown in FIG. 5, the backside of the cap-wafer is thinned to a desired thickness as illustrated, for example, in FIG. 6. Various techniques may be used for the thinning process, including mechanical grinding or polishing techniques. Performing thinning of the cap-wafer after it is bonded to the device-wafer, rather than beforehand, may reduce the likelihood that damage will occur during subsequent handling of the thin cap-wafer.

The amount of thinning will vary depending on the particular application. However, the extent of the thinning may be significant and, in some implementations, may be on the order of 50 µm to several hundred microns. Thus, the final thickness of the cap-wafer for some implementations may be in the range of about 30-70% of the initial wafer thickness. The cap-wafer may be thinned to a final thickness as small as 200 µm or less. Preferably the wafer should not be thinned to less than a height of about 10 µm above the backside pads 35. Otherwise, there is a risk of damage to the pads 35.

After thinning the backside of the cap-wafer, a screen printing or other process may be performed to provide the solder bumps 36 on the backside pads 35 (see FIG. 1).

The wafers then can be diced to form individual packages each of which houses one or more micro components.

The foregoing techniques can provide a relatively thin micro component package that includes hermetically sealed feed-through electrical connections coupling the micro component to electrical contacts on an exterior surface of the package.

Figure 7:
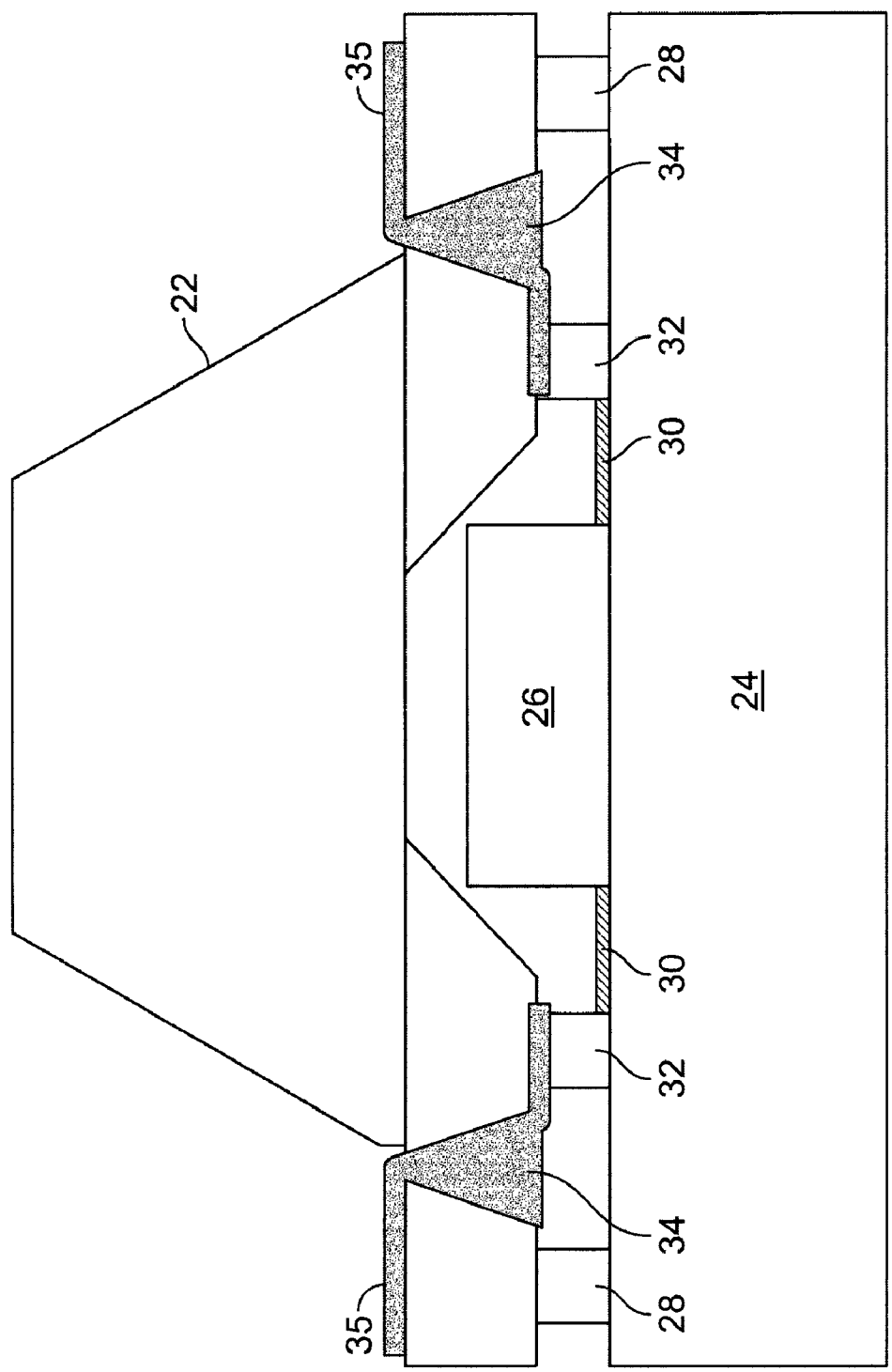
FIGS. 7 and 8 illustrate packages with alternative cap structures for larger micro components.
Figure 8:
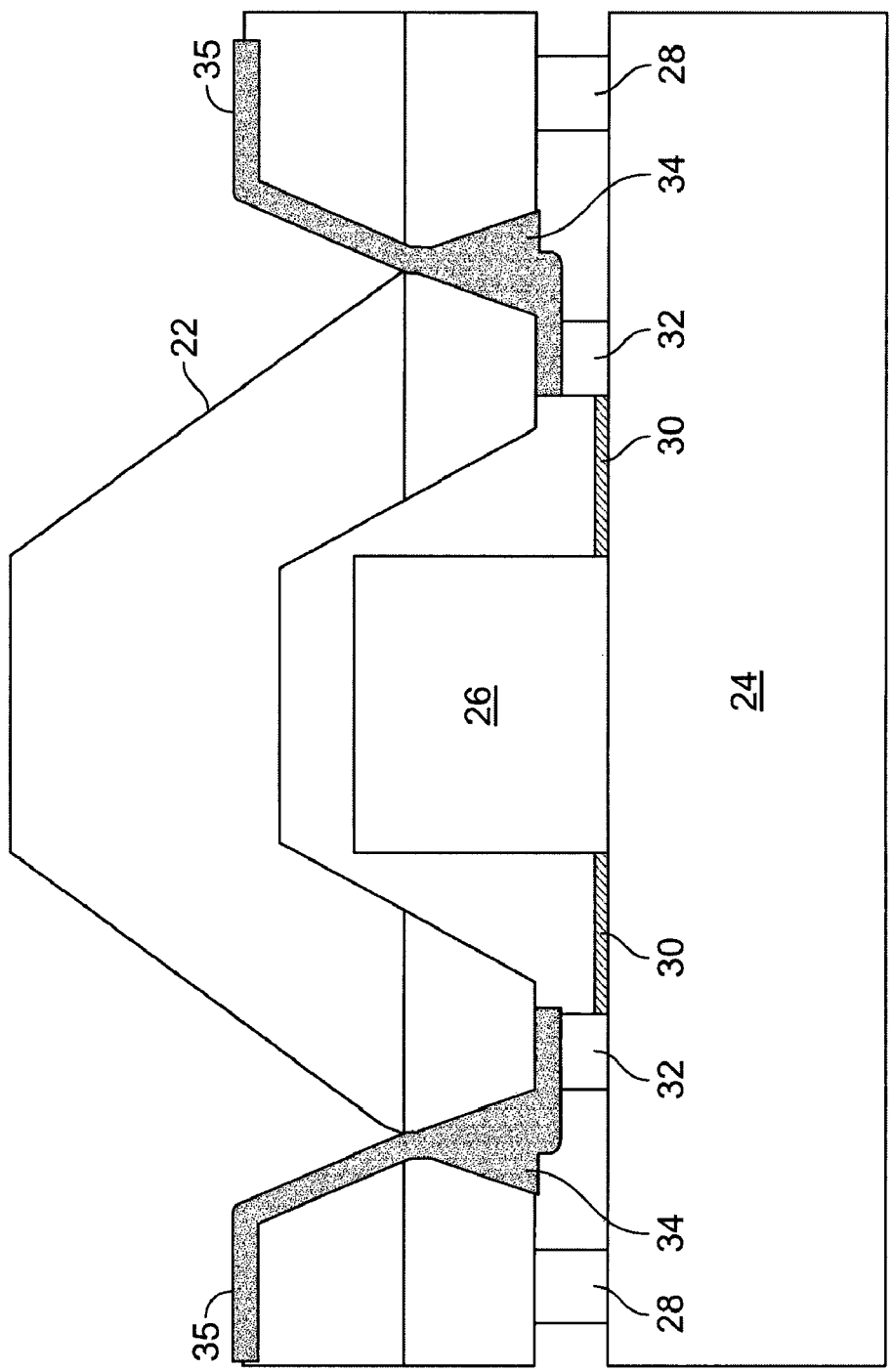

In many implementations, the height of the cavity 46 in which the micro component is located may be as small as the height of the sealing ring 28, which can be, for example, on the order of 5-50 µm. In those situations for which the height of the micro component is greater than that height or greater than the height of the sealing ring 28, an additional cavity 50 may be provided in the front-side surface of the cap-wafer, as shown, for example, in FIGS. 7 and 8. The cavity 50 provides additional room so that a thicker micro component can fit in the area 46. As discussed in connection with the implementation of FIG. 1, the backside of the cap-wafers of FIGS. 7 and 8 may be thinned to a desired thickness after the cap-wafer is bonded to the device-wafer.

Figure 4:
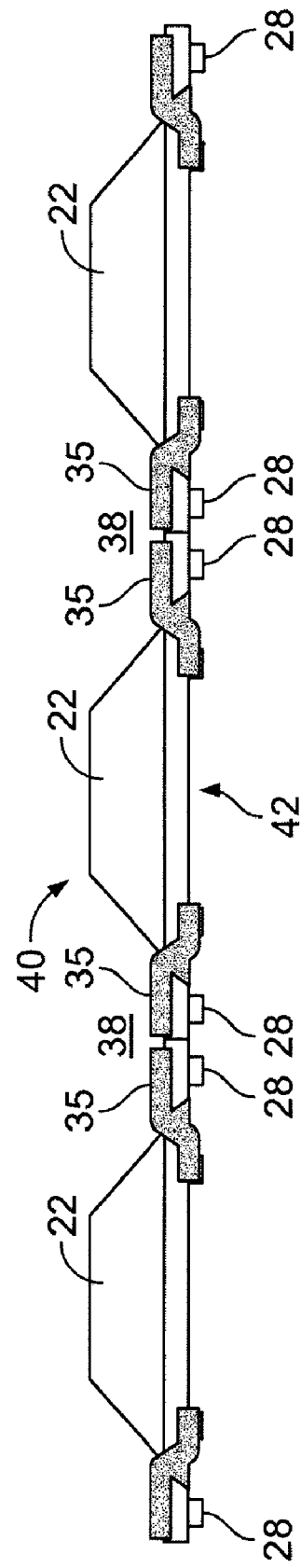

In the foregoing implementations, through-holes 44 that extend from the front-side 42 of the wafer to the backside 40 may be formed in the cap structure 22 before providing the feed-through metallization (compare, e.g., FIGS. 2 and 4). In other implementations, micro-vias for the feed-through metallization need not extend completely through the wafer before providing the feed-through metallization. FIGS. 9-13 illustrate an example of one such technique in which micro-vias extending only partially through the wafer are formed, and feed-through metallization is provided in the micro-vias. During the subsequent back-side wafer-thinning process, the feed-through metallization is exposed so that electrical contacts to the feed-through metallization may be provided.

Figure 9:
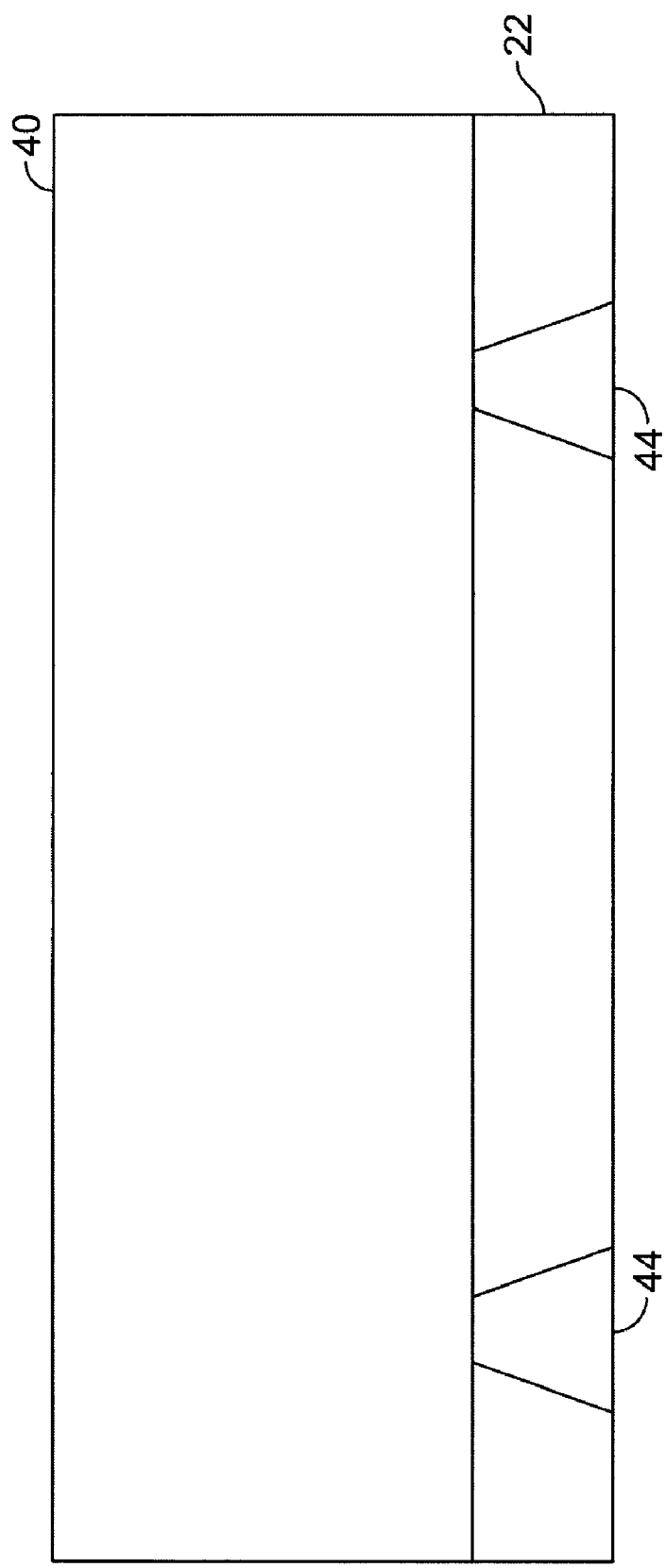
FIGS. 9-13 illustrate another process for fabricating a package for a micro component in which the back-side wafer-thinning technique exposes previously-deposited feed-through metallization.
Figure 10:
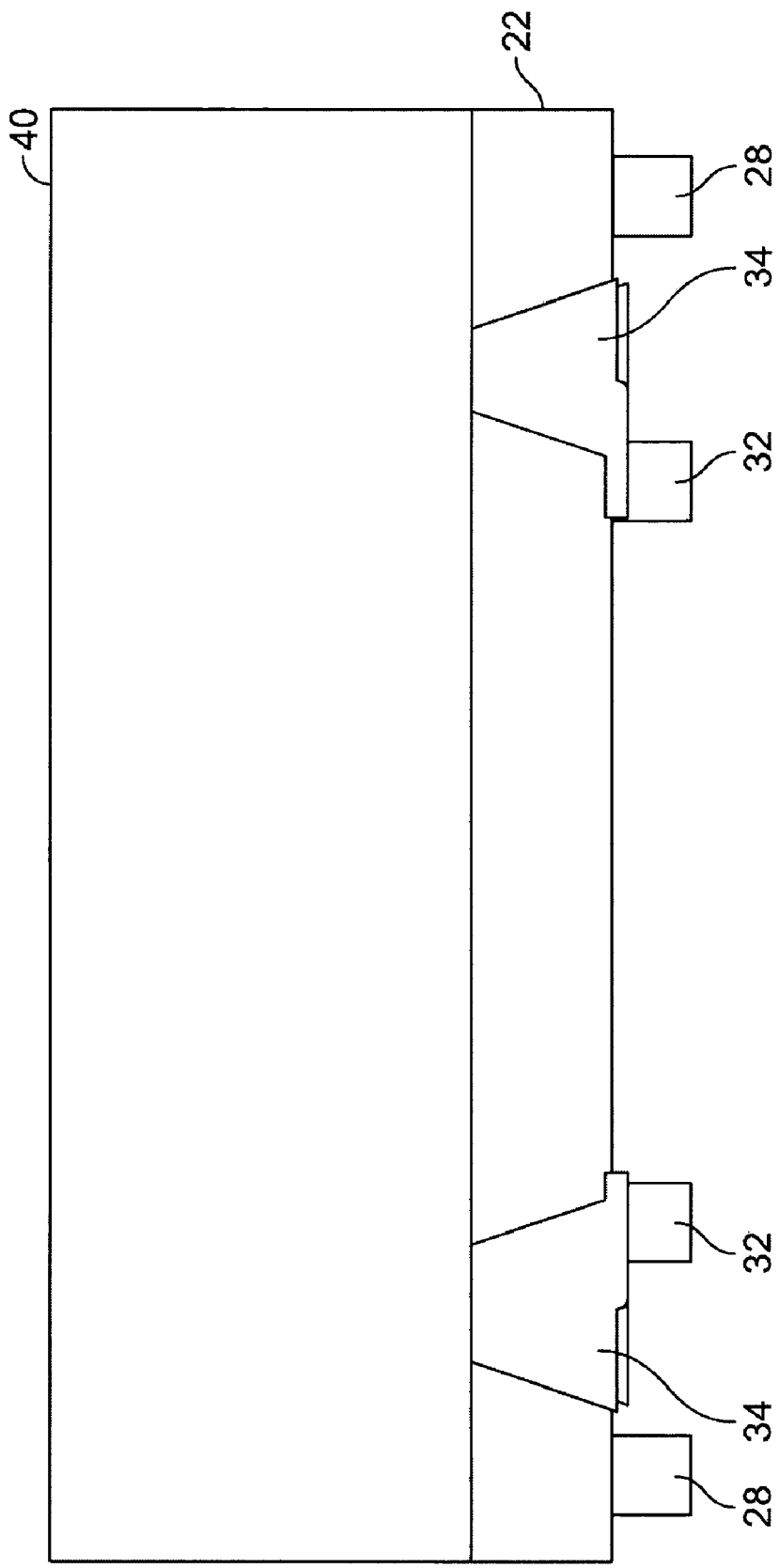
Figure 11:
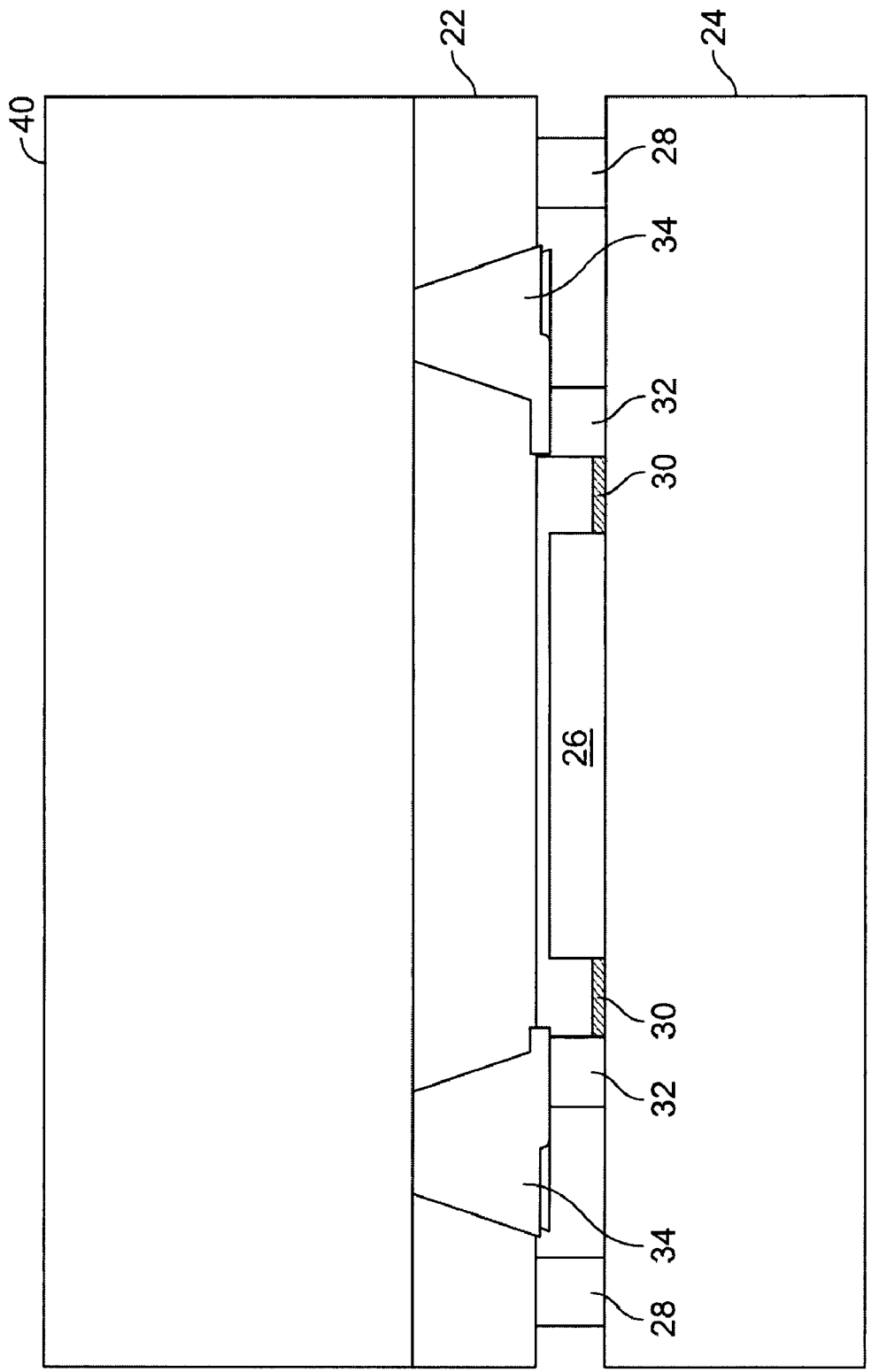
Figure 12:
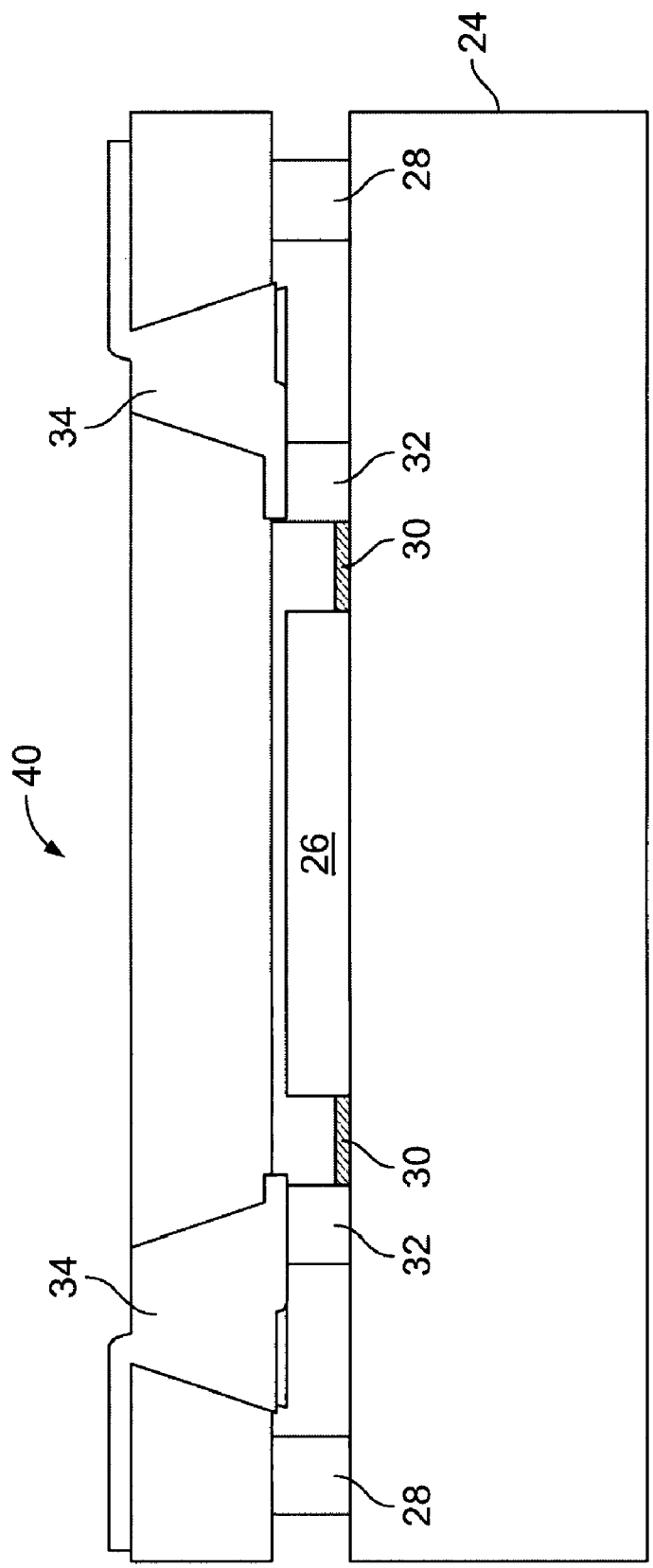
Figure 13:
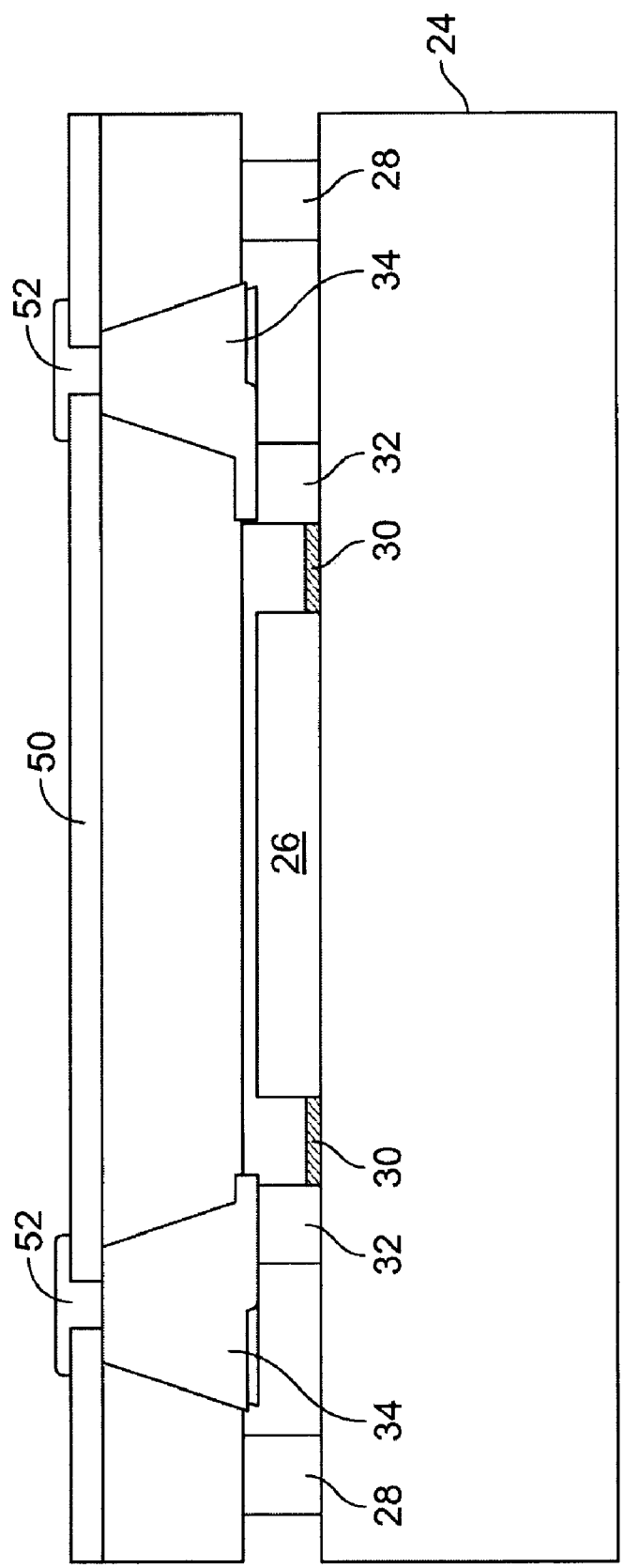

As shown in FIG. 9, micro-vias (e.g., v-grooves) 44 are etched into the front-side surface of the semiconductor wafer that provides the cap structure 22. The depth of the micro-vias 44 may be as small as about 200 µm or less. The inside surfaces of the micro-vias may be oxidized to provide isolation between the feed-through metallization 34 (FIG. 10) and the semiconductor material of the cap structure 22. As shown in FIG. 10, the sealing ring 28 and conductive bumps 32 also are provided on the front-side of the cap 22. The cap-wafer then may be bonded to the device-wafer, as illustrated in FIG. 11. As can be seen from FIG. 11, at that stage of the fabrication process, the feed-through metallization 34 still is not exposed at the back-side 40 of the cap-wafer. Next, as illustrated in FIG. 12, a grinding and polishing process is performed on the back-side 40 of the cap-wafer until the feed-through metallization 34 is exposed. Subsequently, a photosensitive polymer 50 such as photosensitive benzocyclobutene (BCB) or polyimid is deposed on the back-side 40 of the wafer (FIG. 13). Vias are opened in the polymer 50, and conductive contact pads and solder 52 are deposited so that the package can be connected, for example, to a printed circuit board (not shown).

In the foregoing examples, the micro component is mounted in or integrated with a wafer that is bonded to another wafer having the cap structure (including the feed-through metallization). In other implementations, the micro component may be mounted on or integrated with the same wafer in which the feed-through metallization is provided. That wafer subsequently is bonded to another semiconductor or glass wafer that serves as the lid to the package. Such a technique is illustrated in FIGS. 14-23 and allows the back-side wafer-thinning technique to be used for post-processing of the device-wafer.

Figure 14:
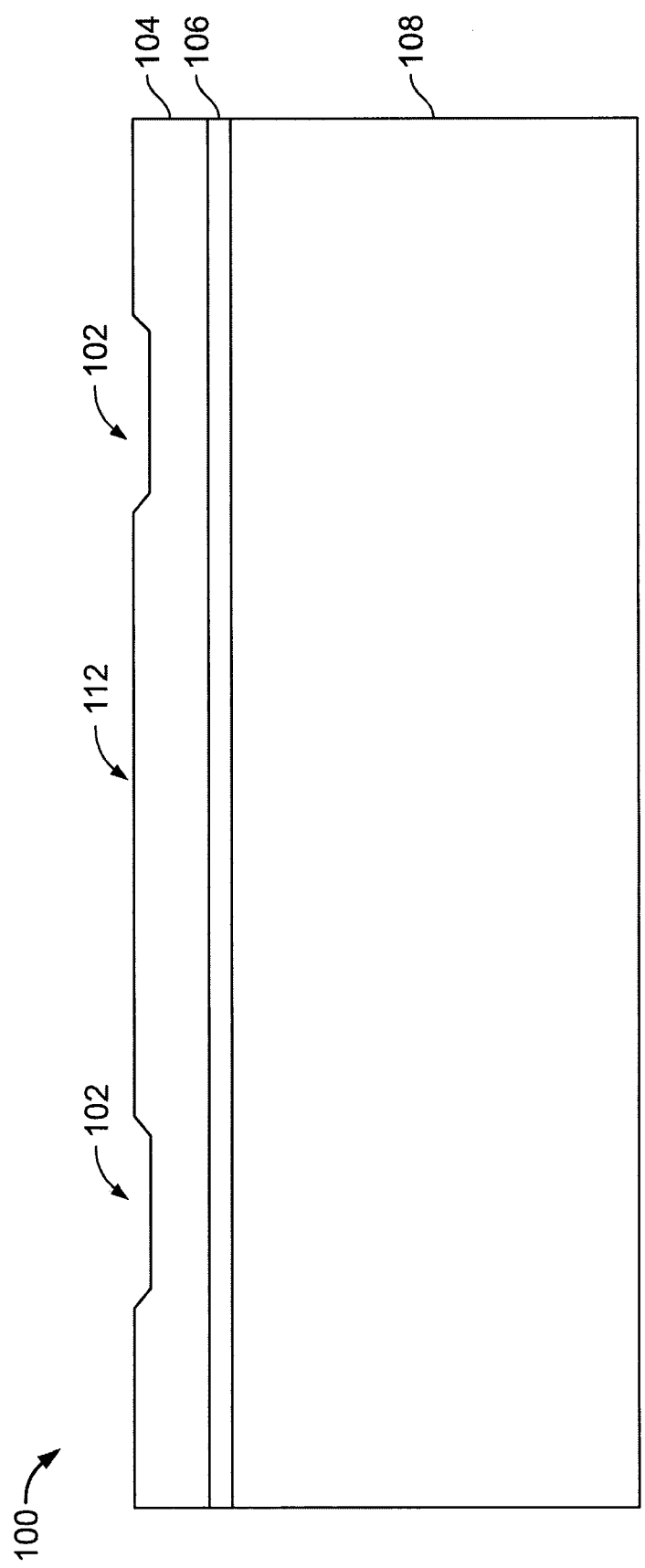
FIGS. 14-23 illustrate another process for fabricating a package for a micro component that is mounted on or integrated with the same wafer in which the feed-through metallization is provided and that includes a back-side wafer-thinning technique.

As illustrated in FIG. 14, shallow redistribution grooves 102 with sloped side-walls may be etched in a first semiconductor wafer 100, which may include, for example, an etch-resistant layer (e.g., a buried oxide layer) 106 sandwiched between a relatively thin (e.g., 10 µm) semiconductor layer 104 and a relatively thick (e.g., 400-600 µm) semiconductor layer 108. As will become clear from the following discussion, the shallow grooves 102 can facilitate the redistribution of electrical connections from the micro component to the contacts on the back-side of the wafer.

In a particular implementation, the first wafer 100 may have, for example, a 6-inch diameter. The semiconductor layers 104, 108 may comprise, for example, silicon. The thickness of the buried oxide layer may have a thickness, for example, of about 1,000 nanometers (nm), and the depth of the redistribution grooves 102 may be about 2-3 µm. Different dimensions may be appropriate in other implementations. A dry etch may be used to form the redistribution grooves 102.

Figure 15:
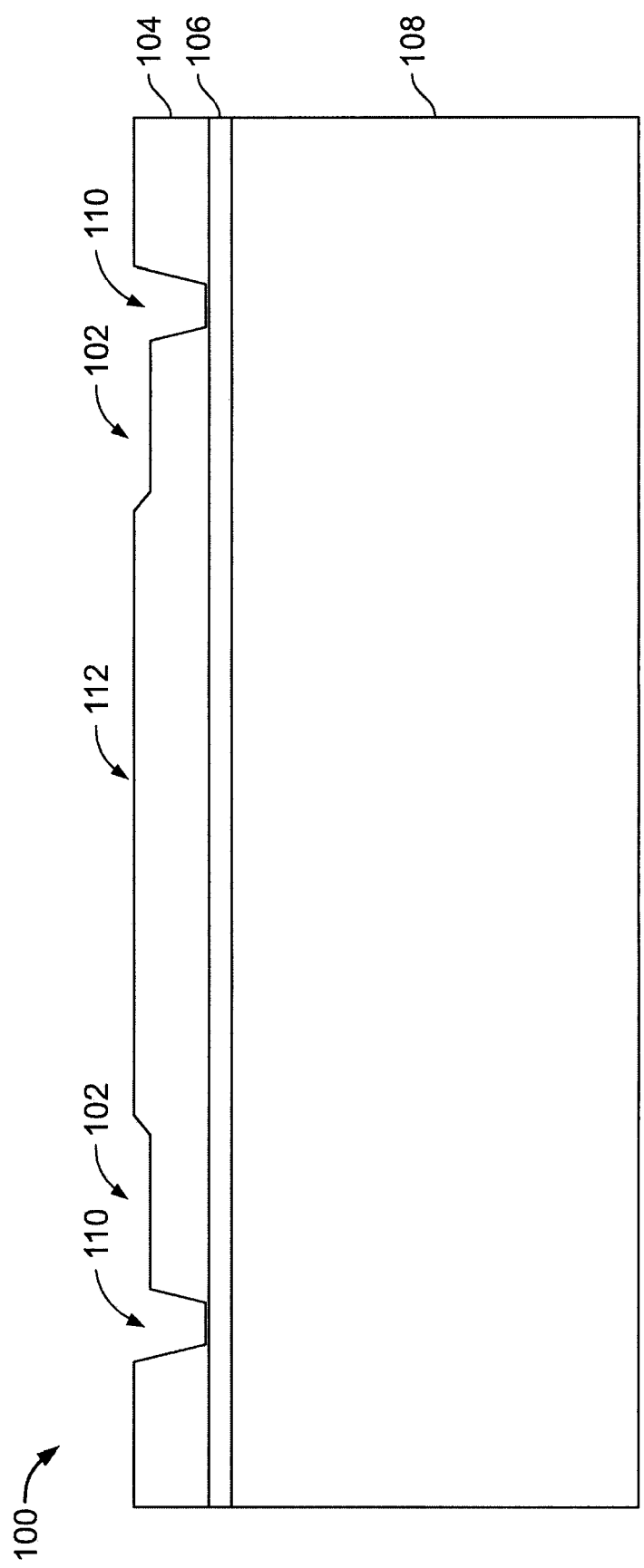
Figure 16:
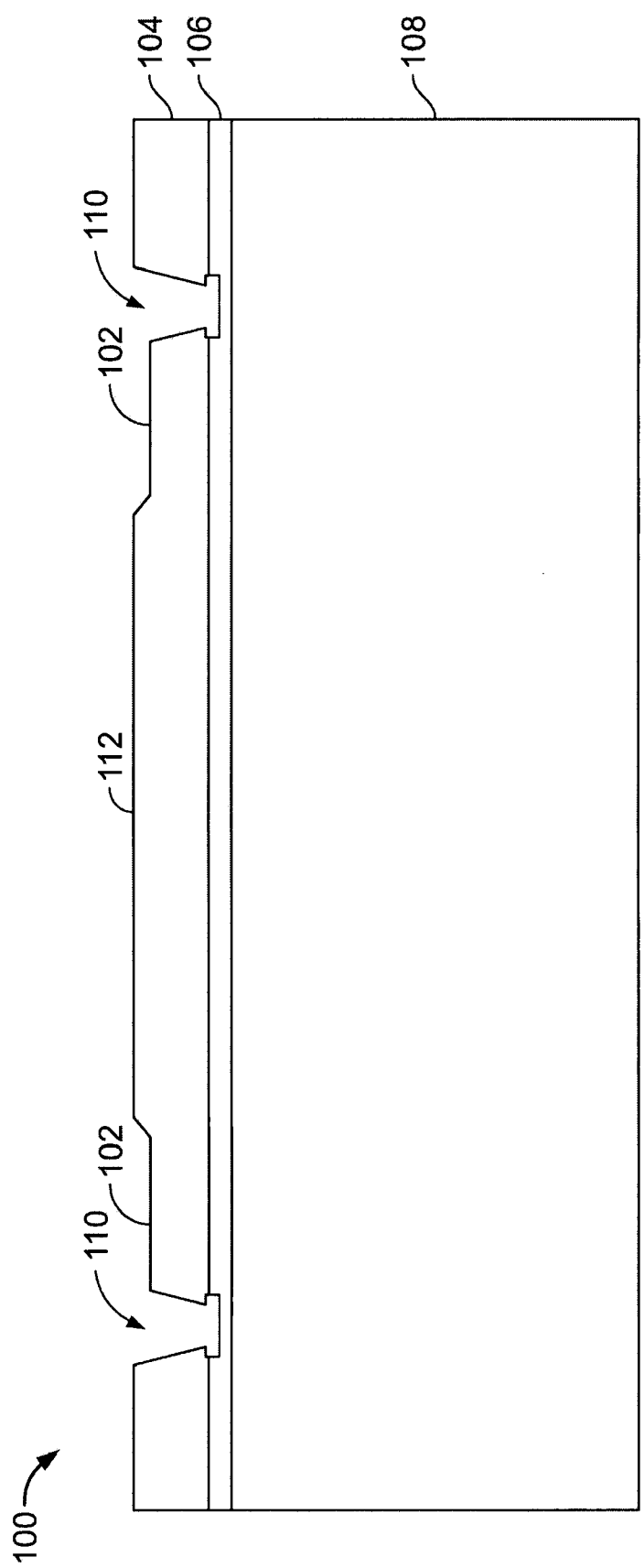

As illustrated in FIG. 15, micro-vias 110 are formed, for example by a dry etch technique, in respective distant ends of the redistribution grooves 102. The micro-vias may be etched until the surface of the etch-resistant layer 106 is exposed. Next, as shown in FIG. 16, a timed buffered hydrogen fluoride (BHF) etch may be performed to extend the depth of the micro-vias partially into the buried oxide layer 106. In a particular implementation, the micro-vias 110 are etched about halfway through the oxide layer 106. The front and back sides of wafer 100 then are covered with an oxide layer 116 (see FIG. 17A), which may have a thickness, for example, of about half the thickness of the buried oxide layer 106. A thermal oxidation process may be used to form the oxide layer 116. Assuming, for example, that the layers 104 and 108 are silicon and the etch-stop layer 106 is silicon oxide, the thermally gown oxide layer 116 will cover the surfaces of the silicon layers 104 and 108.

Figure 17A:
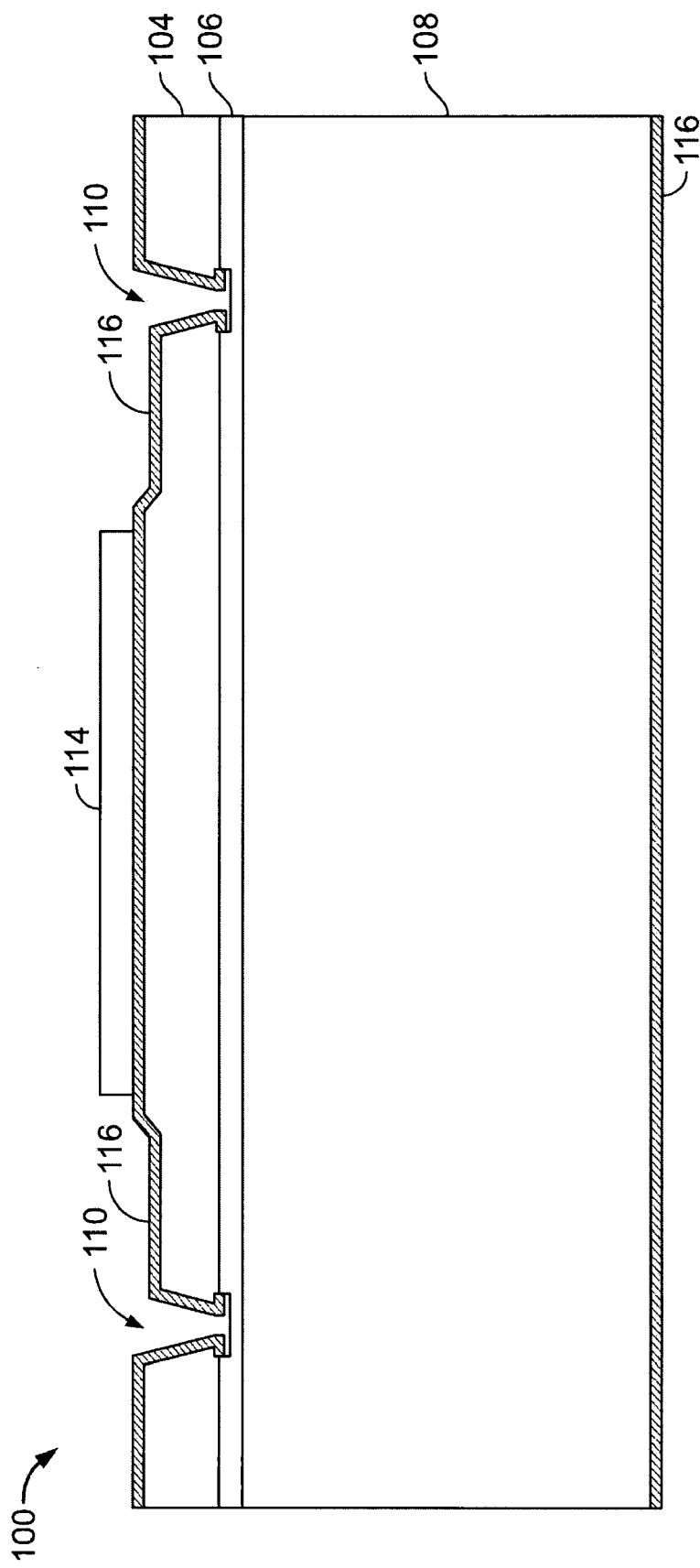
Figure 17B:
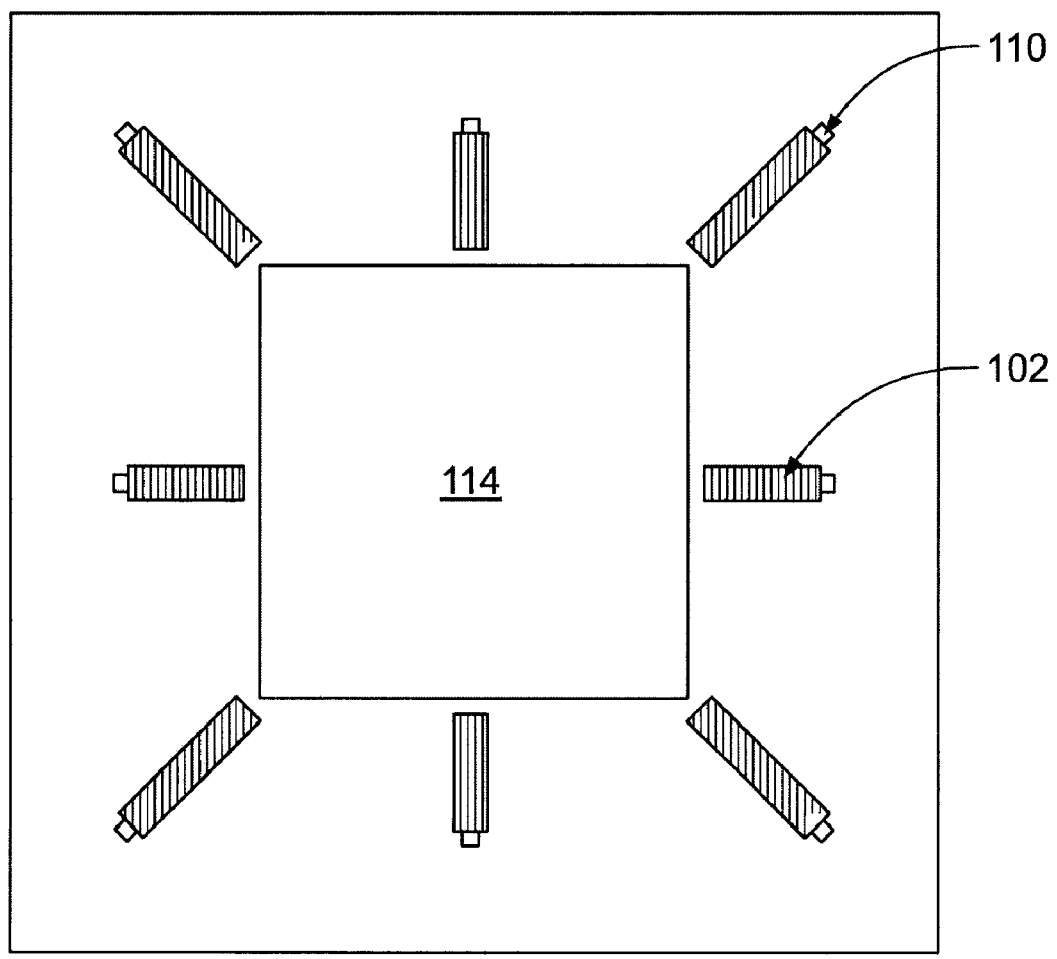

As illustrated in FIG. 17A, a micro component 114 may be mounted on an area of the wafer between the micro-vias 110. The relatively deep micro-vias may be small, and far from the micro component so as not to disturb lithography steps. FIG. 17B illustrates a top-view of the wafer after mounting the micro-component 114.

Figure 18:
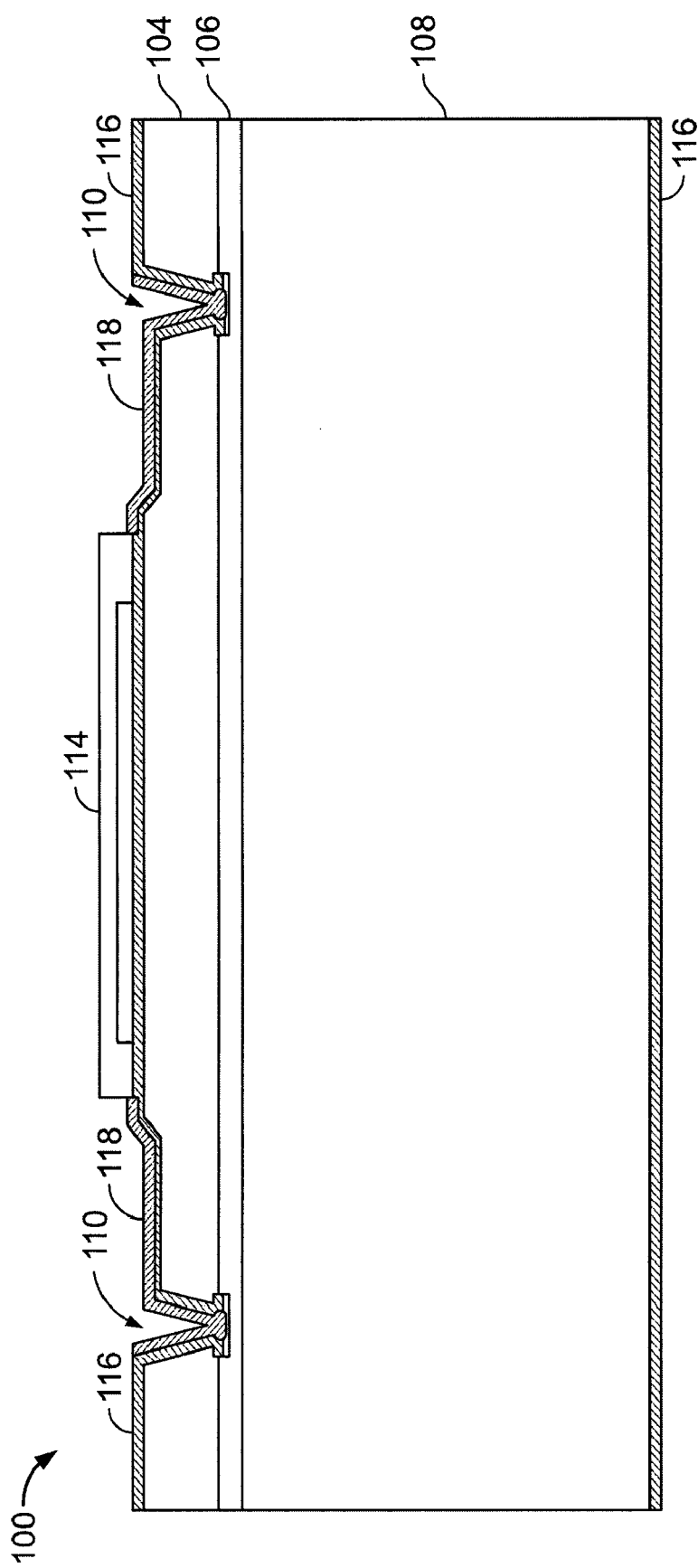

As shown in FIG. 18, conductive lines, such as electroplated gold lines 118, are provided from the micro component 114 to the bottom of the micro-vias 110. Preferably, the thickness of the metal 118 is less than the depth of the redistribution grooves. The bottom of the micro-vias 110 as well as the lower part of the side walls should completely be covered with metal. Further processing of the micro component may also be performed at this stage. For example, if the micro component is a MEMS device, a sacrificial layer may be etched away.

Figure 19:
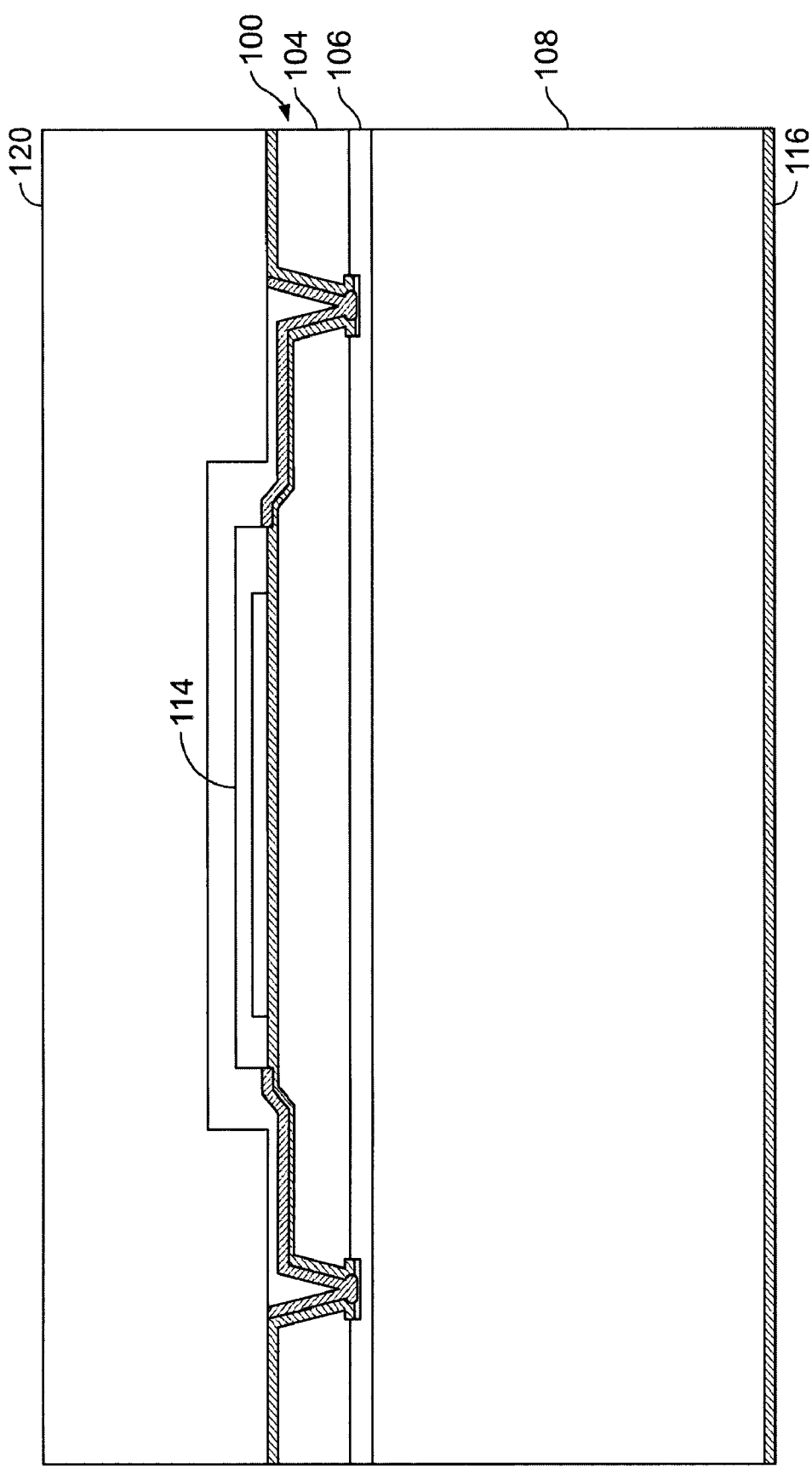
Figure 20:
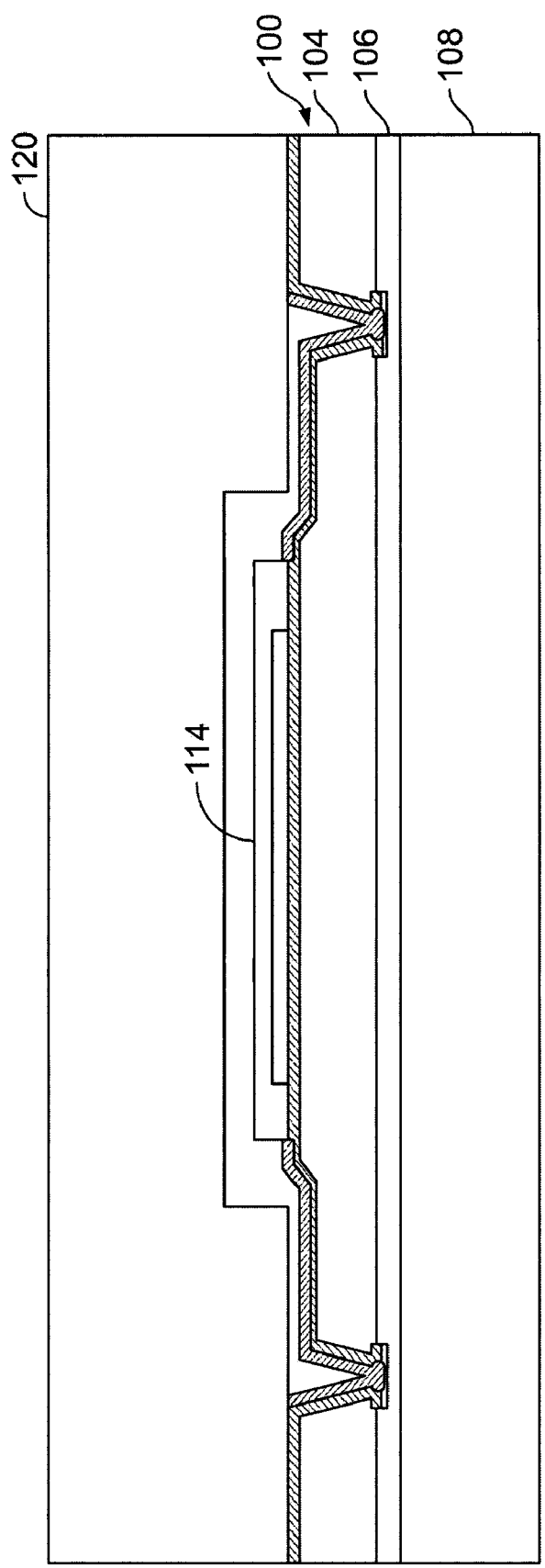

As shown in FIG. 19, a semiconductor or glass lid wafer 120 is bonded to the first wafer 100 so that the micro component 114 is housed within an area defined by the two wafers 100, 120. Various bonding techniques, such as anodic bonding, glass frits reflow, thermal compression bonding or solder reflow, may be used. If metal sealing rings are used to bond the wafers, the gold lines 118 may need to be passivated.

After bonding the wafers, a grinding or other thinning process is performed with respect to the back side of the device-wafer 100. The remaining thickness of the back-side silicon layer 108 may be as small as about 50-100 µm. Preferably, the remaining silicon layer 108 should be thinner than the final height of the electrical bumps (see FIG. 23).

Figure 21:
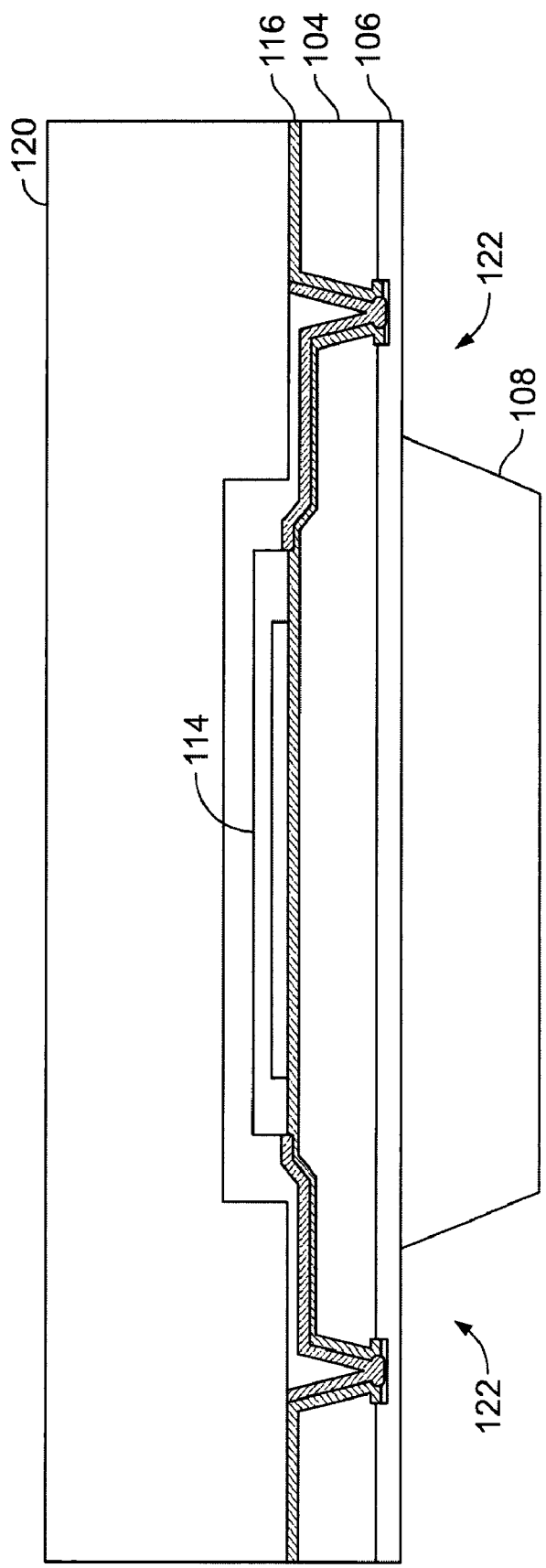
Figure 22:
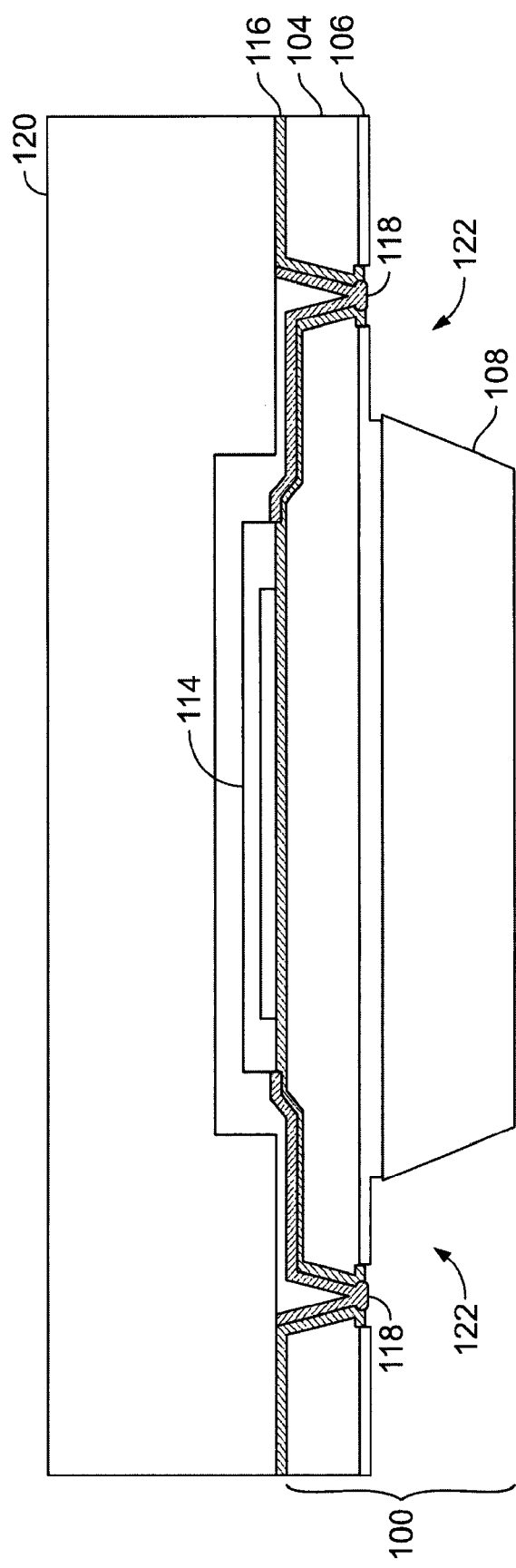

To expose the metal 118 in the micro-vias 110, a dry-etch technique with a photoresist mask may be used to etch cavities 122 with sloped side-walls in the back-side of the silicon layer 108 (FIG. 21). During the dry-etch, the buried oxide layer 106 may serve as an etch-stop layer. Next, as shown in FIG. 22, the metallization 118 at the bottom of the micro-vias 110 may be exposed, for example, using BHF to etch partially through the thin buried oxide layer 106 and any plating base (e.g., titanium) that may have been used during the gold electroplating process. As shown in FIG. 22, the BHF etch is stopped when the feed-through metallization is exposed, with a thin layer of the buried oxide 106 remaining on the back-side of the wafer 100. The remaining oxide 106 provides isolation between the semiconductor material 104 and electrical connections (124, 126) that subsequently are provided on the back-side of the wafer 100 in contact with the feed-through metallization (see FIG. 23). In a particular implementation, the thickness of the remaining oxide layer 106 is about one-half the original thickness of the buried oxide layer.

Figure 23:
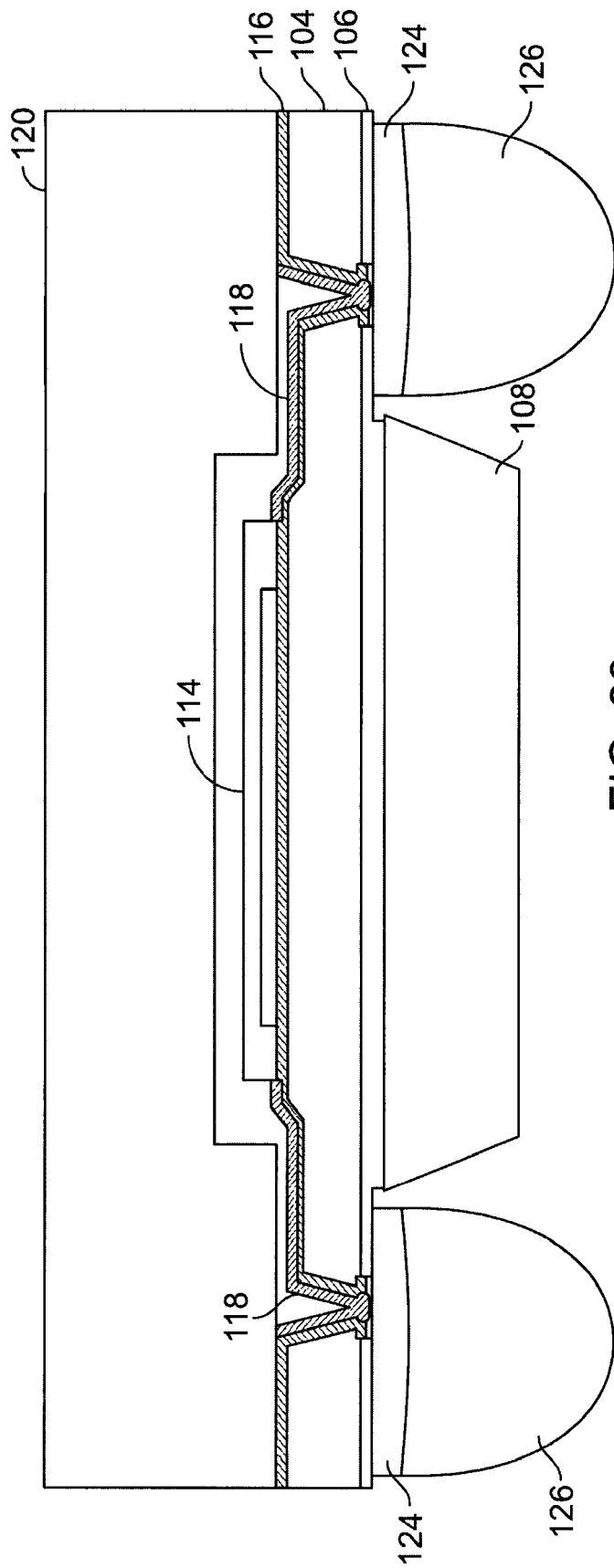

As shown in FIG. 23, back-side metallization 124 may be provided, for example, by using a gold-titanium (TiAu) plating base and copper (Cu) plating. Solder bumps 126 or other electrical contacts may be provided, for example, through a solder screen print and reflow process. The solder bonds 126 may be connected, for example, to a printed circuit board (not shown). The wafers then may be diced to form individual packages, each of which houses one or more micro-components and which is relatively thin.

In the implementations of FIGS. 14-23, post-processing steps, including back-side thinning of the device wafer, may be performed by an entity different from the entity that fabricates the micro components and integrates them with, or mounts them on, the device-wafer. In other situations, the same entity may perform both pre-processing and post-processing steps.

In some implementations, the micro component(s) may include a MEMS-based system for fluid analysis. In such circumstances, the MEMS device may include, for example, a micro pump or a chemical sensor. Additional grooves may be provided in the packages described above to serve as inlet and outlet channels for the fluid.

Figure 24:
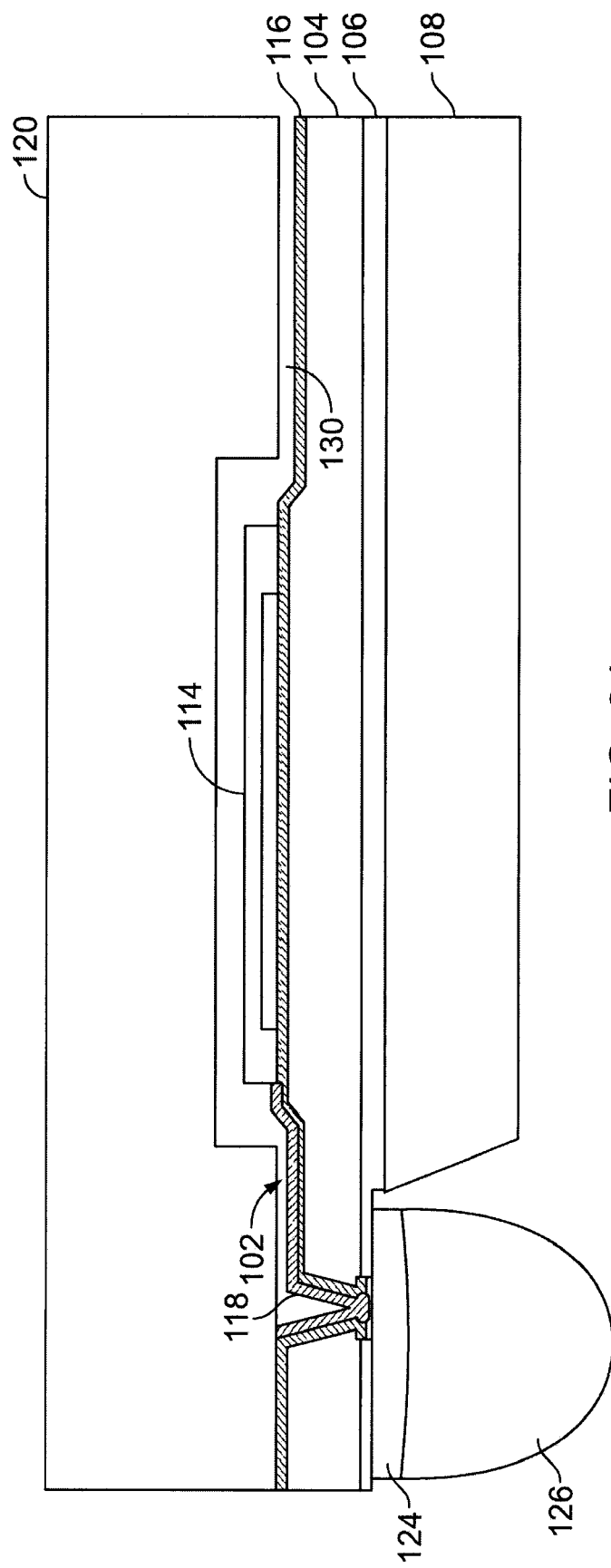
FIG. 24 illustrates a package that includes inlet/outlet fluid channels from the micro component.

FIG. 24 illustrates one such inlet/outlet channel 130, which may be formed at the same time as the redistribution grooves 102 (FIG. 14). Multiple inlet/outlet channels may be provided for the micro component 114 and may be routed to the edge of the package. For example, in a particular implementation, a pair of inlet/outlet channels may be provided on the same side of the package, with the inlet channel provided on one side of a redistribution groove and the outlet channel provided on the other side of the redistribution groove. The width of the inlet/outlet channels 130 may differ from the width of the redistribution grooves.

Figure 25:
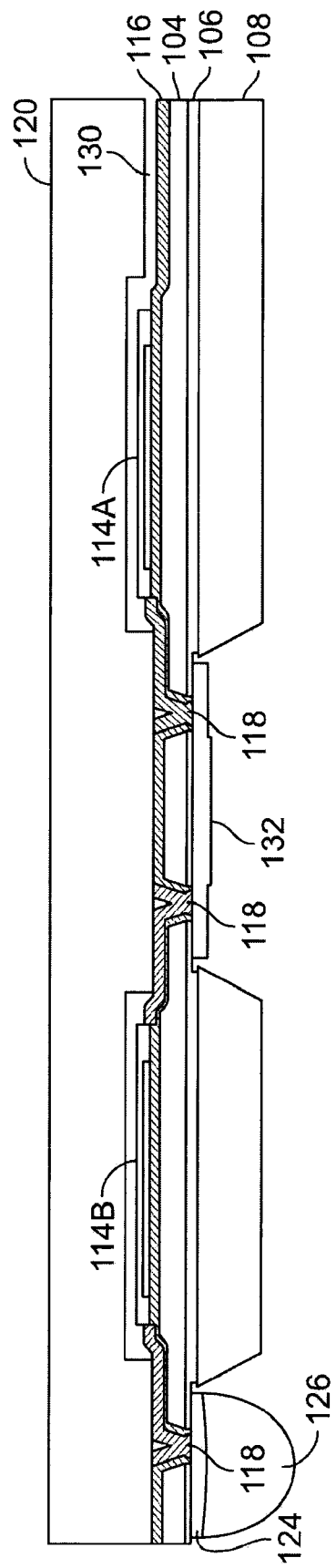
FIG. 25 illustrates a package that includes multiple micro components housed in different enclosed areas of the package.

A package may contain more than one micro component, as shown, for example, in FIG. 25. Furthermore, one part of the package may include a micro component 114A and inlet/outlet channels 130 for fluid analysis, whereas anther part of the package may include a micro component 114B that is hermetically sealed within the package. Various electrical interconnections may be provided to and from the micro components. For example, an electrical connection may be provided from the micro component 114B to the SMD bump 126. In addition, an electrical interconnection 132 may be provided to connect the micro components 114A, 114B electrically. Feed-through metallization 118 provides part of the electrical paths from the micro components to the contacts on the back-side of the package.

Figure 26:
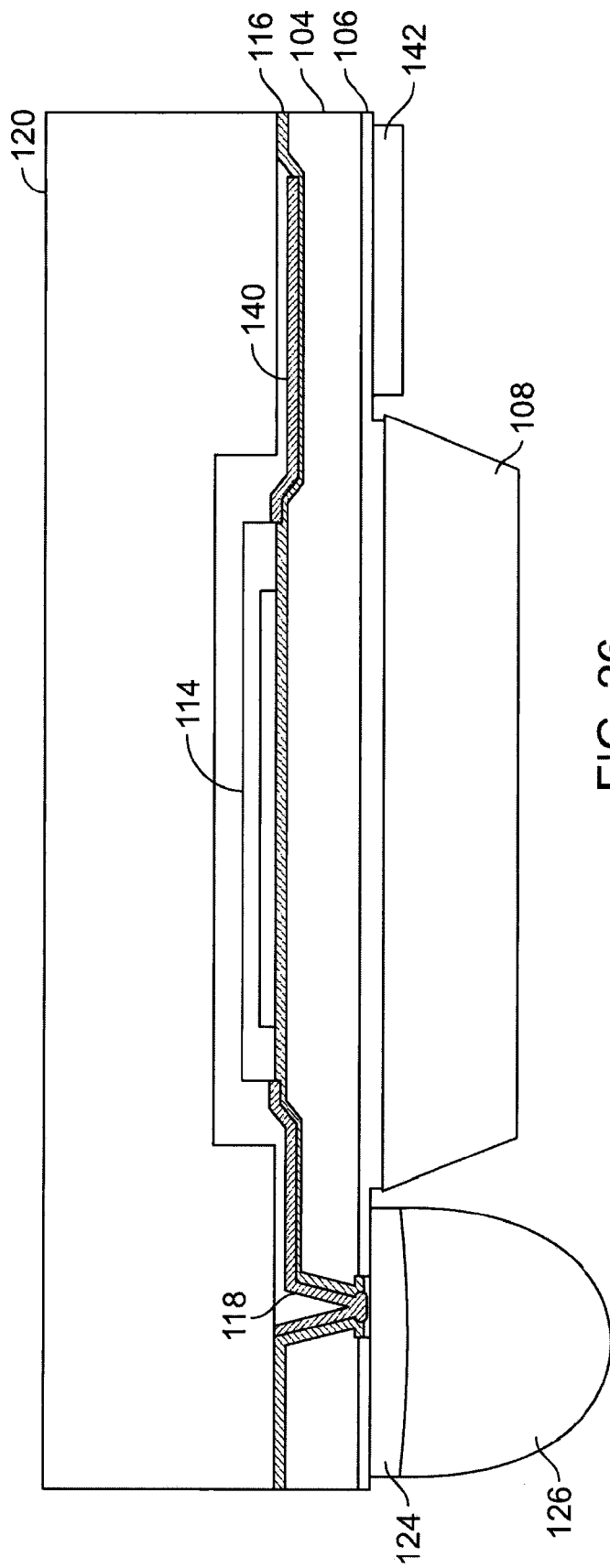
FIG. 26 is a side view of a package that includes a capacitive element.

Other features may be present in some implementations. For example, capacitors or inductors may be integrated into the package, and in particular, they may be integrated into the cap-wafer. FIG. 26 illustrates an example of an integrated capacitor structure, which includes metallized surfaces 140, 142 on either side of the SOI layer (i.e., the silicon layer 104 on the oxide layer 106). The metallization 140 can be formed on the front side of the device-wafer 100 at the same time as the feed-through metallization 118. The metallization 142 can be provided on the back-side of the wafer 100 at the same time as the back-side metallization 124. Therefore, capacitive elements may be formed without additional process steps. In some implementations, as a result of the very thin SOI layer, capacitors having large capacitance (e.g., 1-10 nanoFarads) can be formed on an area as small as 100 μm².

Figure 27A:
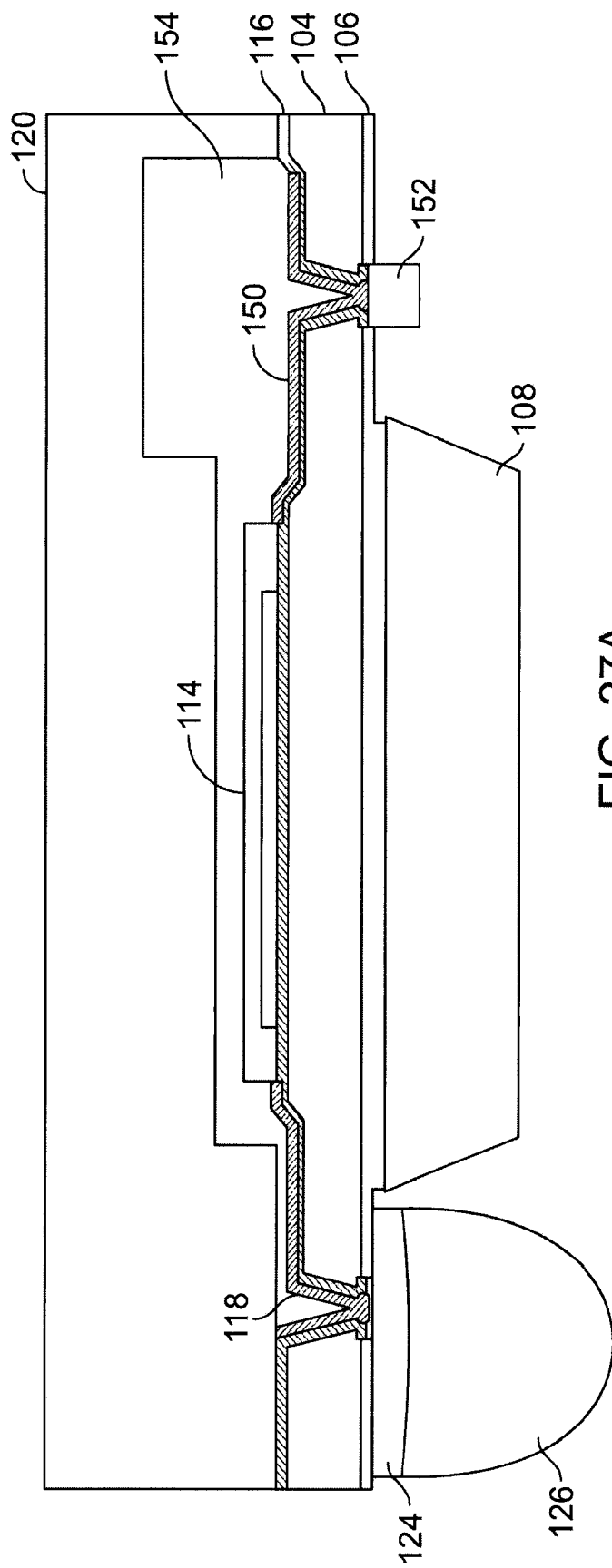
FIG. 27A is a side view of a package that includes an inductive element.
Figure 27B:
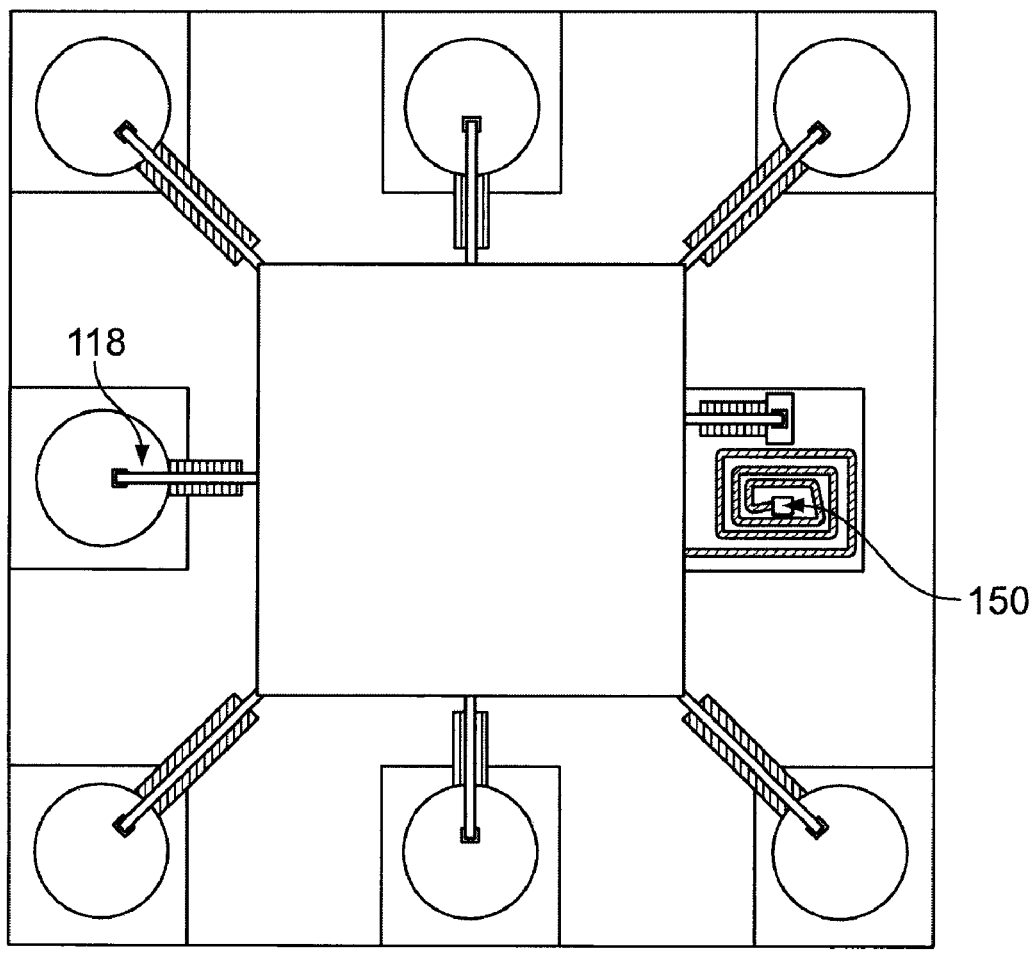
FIG. 27B is a top view of the package of FIG. 27A.

FIGS. 27A and 27B illustrate an example of an inductive micro coil integrated into the package. Metallization in the form a coil 150 may be provided, for example, on the front-side of the device-wafer 100 and is routed through a micro-via toward the back-side. Metallization 152 on the back-side of the wafer 100 is routed through a second micro-via extending through the oxide layer 106 and provides electrical connection to the front-side metallization 150. The front-side metallization for the coil can be provided at the same time as the feed-through metallization 118. Similarly, the backside metallization 152 can be provided at the same time as the metallization 124. Therefore, inductive elements may be formed without additional process steps. The lid-wafer 120 may include additional headroom 154 above the micro coil 150 to help reduce magnetic losses in the coil.

Figure 28:
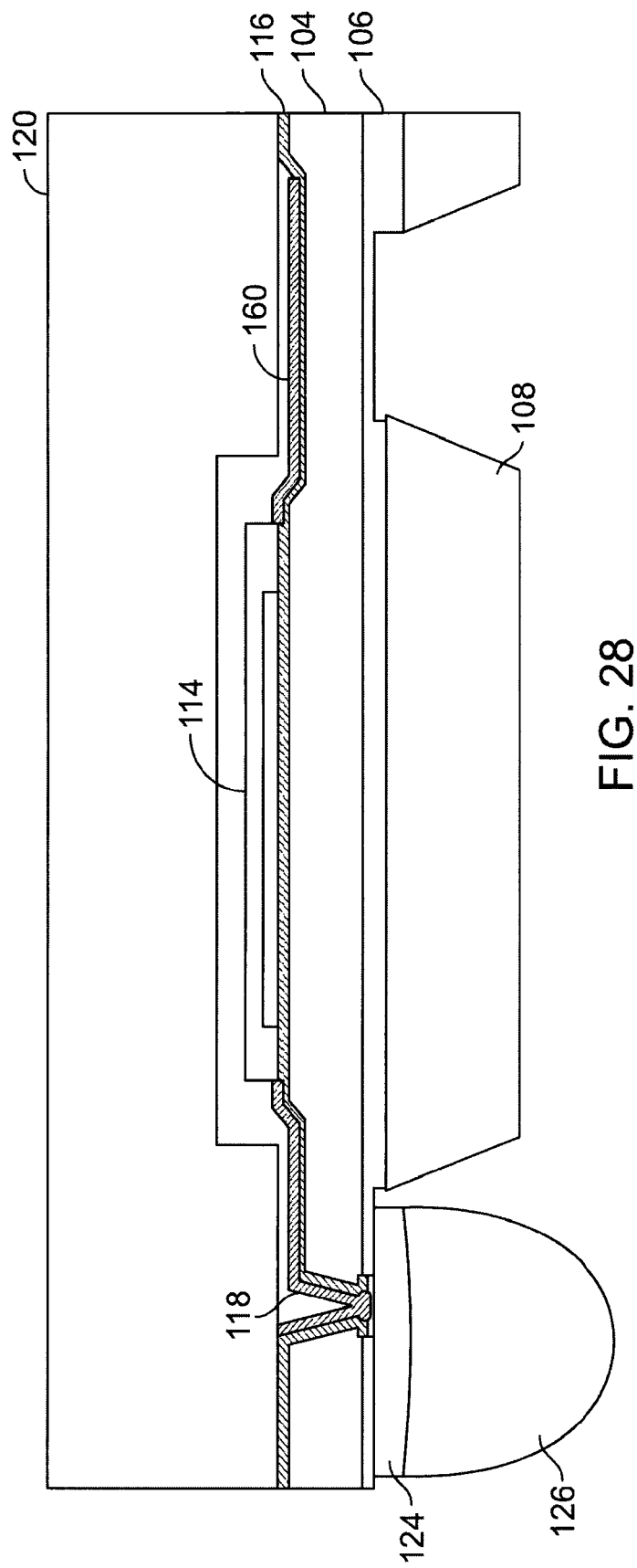
FIG. 28 is a side view of a package that includes a pressure sensing membrane in the SOI layer.

FIG. 28 illustrates an example of a thin membrane 160 formed in device layer of the SOI wafer. The membrane 160 may be used, for example, as part of a pressure sensor or to detect pressure variations inside the package through small deflections of the membrane. Known techniques may be used to convert the small pressure variations into electrical signals, which may serve as an indicator of possible leaks in the package and as a warning for possible failure of the micro component as a result of the leak.

The micro component is located in an area defined by the first and second wafers (e.g., the cap-wafer and the lid-wafer). Although the figures show the micro component as being mounted on one of the wafers, in some implementations the micro component may be integrated within one of the wafers.

Other implementations are within the scope of the claims.

What is claimed is:

1. A method of fabricating a package for a micro component, the method comprising:
   bonding a first wafer to a second wafer so that the micro component is located in an area defined by the first and second wafers, wherein the first wafer includes feed-through metallization that at least partially fills micro-vias from the front-side of the first wafer, and wherein the feed-through metallization forms part of one or more electrically conductive paths to or from the micro component when the first and second wafers are bonded together;
   providing cavities in the back-side of the first wafer opposite the micro-vias in the front-side of the first wafer;
   providing electrically conductive contacts on the back-side of the first wafer that are electrically coupled to the feed-through metallization; and
   subsequently thinning the first wafer from its back-side, wherein forming the cavities and providing the conductive contacts is performed before thinning the back-side of the first wafer.

2. The method of claim 1 wherein said thinning includes thinning the first wafer to a thickness of 200 μm or less.

3. The method of claim 1 wherein said thinning includes thinning the first wafer to a thickness of 100 μm or less.

4. The method of claim 1 including thinning the first wafer to a thickness of less than 50% its original thickness.

5. The method of claim 1 wherein thinning the back-side of the first wafer includes using a mechanical process.

6. The method of claim 1 wherein thinning the back-side of the first wafer includes grinding the back-side of the first wafer.

7. The method of claim 1 wherein the micro component is mounted on or integrated with the second wafer.

8. The method of claim 7 including providing a cavity in the front-side of the first wafer to provide room for the micro component.

9. The method of claim 1 wherein the micro component is mounted to or integrated with the first wafer.

10. The method of claim 9 including providing a cavity in the front-side of the second wafer to provide room for the micro component.

11. The method of claim 1 wherein the first wafer comprises a semiconductor material and the second wafer comprises a glass or semiconductor material.

12. The method of claim 1 wherein the method is part of a wafer-level batch process.

13. The method of claim 1 wherein at least one of the wafers is an SOI wafer.

14. The method of claim 1 wherein at least one of the wafers includes a semiconductor layer on an isolating layer.

15. A method of fabricating a package for a micro component, the method comprising:
   bonding a first wafer to a second wafer so that the micro component is located in an area defined by the first and second wafers, wherein the first wafer includes feed-through metallization that at least partially fills micro-vias from the front-side of the first wafer, and wherein the feed-through metallization forms part of one or more electrically conductive paths to or from the micro component when the first and second wafers are bonded together;
   subsequently thinning the first wafer from its back-side, removing material from the back-side of the first wafer, after said thinning, to expose the feed-through metallization, wherein removing material from the back-side of the first wafer includes forming cavities in the back-side of the first wafer and partially etching away a buried oxide layer or other isolating etch stop layer to expose the feed-through metallization; and providing electrical contacts at the back-side of the first wafer to contact the exposed feed-through metallization.

16. A method of fabricating a package for a micro component, the method comprising:

bonding a first wafer to a second wafer so that the micro component is located in an area defined by the first and second wafers, wherein the first wafer includes feed-through metallization that at least partially fills micro-vias from the front-side of the first wafer, and wherein the feed-through metallization forms part of one or more electrically conductive paths to or from the micro component when the first and second wafers are bonded together;

forming, prior to bonding the first and second wafers together, shallow grooves in the front-side of the first wafer adjacent an area for the micro component; and forming a respective one of the micro-vias in each of the shallow grooves toward an end of the groove that is further from the area for the micro component.

* * * * *